(12) United States Patent
Kohl et al.

(10) Patent No.: US 6,610,593 B2
(45) Date of Patent: Aug. 26, 2003

(54) FABRICATION OF SEMICONDUCTOR DEVICE WITH AIR GAPS FOR ULTRA LOW CAPACITANCE INTERCONNECTIONS AND METHODS OF MAKING SAME

(75) Inventors: Paul Albert Kohl, Atlanta, GA (US); Sue Ann Bidstrup Allen, Atlanta, GA (US); Clifford Lee Henderson, Lilburn, GA (US); Hollie Anne Reed, Smyrna, GA (US); Dhananjay M. Bhusari, Kaiserslautern (DE)

(73) Assignee: Georgia Tech Research Corporation, Atlanta, GA (US)

( * ) Notice: Subject to any disclaimer, the term of this patent is extended or adjusted under 35 U.S.C. 154(b) by 0 days.

(21) Appl. No.: 09/945,305

(22) Filed: Aug. 31, 2001

(65) Prior Publication Data

US 2002/0081787 A1 Jun. 27, 2002

Related U.S. Application Data

(60) Provisional application No. 60/229,660, filed on Aug. 31, 2000, provisional application No. 60/229,658, filed on Aug. 31, 2000, and provisional application No. 60/229,589, filed on Aug. 31, 2000.

(51) Int. Cl.⁷ ............................................. H01L 21/4763
(52) U.S. Cl. .................... 438/623; 438/778; 438/780
(58) Field of Search ................................ 438/622, 623, 438/637, 638, 639, 640, 778, 780

(56) References Cited

U.S. PATENT DOCUMENTS

| 3,890,636 A | 6/1975 | Harada et al. |
| 3,933,772 A | 1/1976 | Takahashi et al. ......... 260/87.3 |
| 4,460,712 A | 7/1984 | Blizzard et al. .............. 521/92 |
| 4,923,678 A | 5/1990 | Benedikt et al. ............ 428/209 |
| 4,987,101 A | 1/1991 | Kaanta et al. |
| 5,011,730 A | 4/1991 | Tenney et al. .............. 428/209 |

(List continued on next page.)

FOREIGN PATENT DOCUMENTS

| EP | 0445755 | 3/1991 |
| EP | 0936230 | 10/1997 |
| EP | 0881668 | 5/1998 |
| EP | 0 997 497 B1 | 5/2000 |
| JP | 63099206 | 10/1986 |
| WO | 9720871 | 6/1997 |
| WO | 98/32169 | 7/1998 |

OTHER PUBLICATIONS

Communication relating to the results of the partial International Serach for International Application No. PCT/US01/27224 mailed Sep. 16, 2002.

PCT International Search Report, for application No. PCT/US99/12467 dated May 6, 1998.

IBM Technical Dicslosure Bulletin, Low Dielectric Constant Inorganic Insulators for Beol and Packaging Applications, vol. 37.

IBM Technical Disclosure Bulletin, Reduced Capacitance Interconnect System Using Decomposition of Air Gap Filler Material, Sep. 1995.

(List continued on next page.)

Primary Examiner—Tuan H. Nguyen
(74) Attorney, Agent, or Firm—Renner, Otto, Boisselle & Sklar, LLP

(57) ABSTRACT

A method of forming an air gap or gaps within solid structures and specifically semiconductor structures to reduce capacitive coupling between electrical elements such as metal lines, wherein a sacrificial material is used to occupy a closed interior volume in a semiconductor structure is disclosed. The sacrificial material is caused to decompose into one or more gaseous decomposition products which are removed, in one embodiment by diffusion, through an overcoat layer. The decomposition of the sacrificial material leaves an air gap or gaps at the closed interior volume previously occupied by the sacrificial material. The air gaps may be disposed between electrical leads to minimize capacitive coupling therebetween. Also disclosed are methods of forming multi-level air gaps and methods or forming over-coated conductive lines or leads wherein a portion of the overcoating is in contact with at least one air gap.

66 Claims, 24 Drawing Sheets

U.S. PATENT DOCUMENTS

| | | | |
|---|---|---|---|
| 5,049,632 A | 9/1991 | Asrar | 526/262 |
| 5,103,288 A | 4/1992 | Sakamoto et al. | |
| 5,117,327 A | 5/1992 | Asrar et al. | 361/323 |
| 5,135,595 A | 8/1992 | Acocella et al. | 156/89 |
| 5,139,851 A | 8/1992 | Acocella et al. | 428/209 |
| 5,139,852 A | 8/1992 | Baise et al. | 428/209 |
| 5,180,754 A | 1/1993 | Morita et al. | 521/85 |
| 5,266,126 A | 11/1993 | Deguchi | 136/256 |
| 5,274,026 A | 12/1993 | Benedikt et al. | 524/553 |
| 5,277,725 A | 1/1994 | Acocella et al. | 156/89 |
| 5,324,683 A | 6/1994 | Fitch et al. | |
| 5,358,975 A | 10/1994 | Anderson | 521/77 |
| 5,461,003 A | 10/1995 | Havemann et al. | |
| 5,468,819 A | 11/1995 | Goodall et al. | 526/171 |
| 5,508,542 A | 4/1996 | Geiss et al. | 257/301 |
| 5,569,711 A | 10/1996 | Yamamoto et al. | 525/66 |
| 5,585,433 A | 12/1996 | Yamamoto et al. | 525/66 |
| 5,635,419 A | 6/1997 | Geiss et al. | 438/386 |
| 5,641,712 A | 6/1997 | Grivna et al. | 438/624 |
| 5,679,444 A | 10/1997 | Davis et al. | 428/209 |
| 5,681,900 A | 10/1997 | Murakami et al. | 525/339 |
| 5,700,844 A | 12/1997 | Hedrick et al. | 521/77 |
| 5,709,805 A | 1/1998 | Davis et al. | 216/18 |
| 5,744,399 A | 4/1998 | Rostoker et al. | 438/622 |
| 5,756,021 A | 5/1998 | Hedrick et al. | 264/45.1 |
| 5,767,014 A | 6/1998 | Hawker et al. | 438/623 |
| 5,773,197 A | 6/1998 | Carter et al. | 430/313 |
| 5,776,990 A | 7/1998 | Hedrick et al. | 521/77 |
| 5,869,880 A | 2/1999 | Grill et al. | 257/522 |
| 5,883,219 A | 3/1999 | Carter et al. | 528/310 |
| 5,895,263 A | 4/1999 | Carter et al. | 438/624 |
| 5,953,627 A | 9/1999 | Carter et al. | 438/623 |
| 5,962,113 A | 10/1999 | Brown et al. | 428/209 |
| 6,071,805 A | 6/2000 | Liu | 438/619 |
| 6,162,838 A | 12/2000 | Kohl | 521/77 |
| 6,165,890 A | 12/2000 | Kohl et al. | 438/619 |
| 6,303,464 B1 | 10/2001 | Gaw et al. | 438/422 |

OTHER PUBLICATIONS

Materials Research Society, Controlling Porosity in Bridged Polysilsequioxanes Through Elimination Reactions, vol. 435, p. 277–282.

IEEE Transactions on Electron Devices, Use of as Low–K Interlayer Dielectric in LSI's: Demonstration of Feasibility, vol. 44, No. 11, Nov. 1997 p. 1–7.

IEEE Electron Device Letters, Air–Gap Formation During IMD Deposition to Lower Interconnect Capacitance, vol. 19, No. 1, Jan. 1998 p. 1–3.

Electrochemical and Solid–State Letters, Low k, Porous Methyl Silsequioxane and Spin–On–Glass, 1999, p. 77–79.

Technology News, Wafer Processing, The New Low –k Candidate: It's A Gas, p. 38, Mar. 1999.

Materials Research Society, Symposium Proceedings, Low–Dielectric Constant Materials IV, vol. 511, 1998.

Advanced Materials, Research News, Templating Nanoporosity in Thin–Film Dielectric Insulators, 1998, p. 1049–1053.

Deposition, Air Gaps Lower k of Interconnect Dielectrics, Feb. 1999, p. 51–58.

FABRICATION OF SEMICONDUCTOR DEVICE WITH AIR GAPS FOR ULTRA LOW CAPACITANCE INTERCONNECTIONS AND METHODS OF MAKING SAME

RELATED APPLICATION DATA

This application claims priority to previously filed U.S. Provisional Application No. 60/229,589, filed on Aug. 31, 2000, entitled "Compositions for Fabrication of Semiconductor Devices with Air Gaps for Ultra Low Capacitance Interconnections and Methods of Making Same"; U.S. Provisional Application No. 60/229,660, filed on Aug. 31, 2000, entitled "Compositions for Fabrication of Semiconductor Devices with Multi-Level Air Gaps for Ultra Low Capacitance Interconnections and Methods of Making Same"; and U.S. Provisional Application No. 60/229,658, filed on Aug. 31, 2000 entitled "Fabrication of Semiconductor Devices with Air Gaps for Ultra Low Capacitance Interconnections and Methods of Making Same", all of which are incorporated herein by reference in their entireties.

FIELD OF THE INVENTION

The invention herein described relates generally to the fabrication of semiconductor devices and more specifically to such devices that use air gaps and/or multi-level air gaps to reduce capacitive coupling between conductors in such devices. Additionally, the invention herein described relates to the fabrication of semiconductor devices which can contain overcoated conductive lines or leads which are at least partially adjacent to one or more air gaps.

BACKGROUND OF THE INVENTION

As a consequence of the progress made in integrated circuit technology, the spacing between the metal lines on any given plane of an integrated circuit has become less and less, now extending into the submicrometer range. By reducing the spacing between conductive members in the integrated circuit, an increase in capacitive coupling occurs. This increase in capacitive coupling causes greater crosstalk, higher capacitive losses and increased RC time constant.

In order to reduce capacitive coupling, much effort has been directed toward developing low dielectric constant (low-K) materials to replace conventional dielectric materials that are interposed between the metal lines on a given layer and between layers. Many conventional electronic insulators have dielectric constants in the 3.5 to 4.2 range. For example, silicon dioxide has a dielectric constant of 4.2 and polyimides typically have dielectric constants from 2.9 to 3.5. Some advanced polymers have dielectric constants in the 2.5 to 3.0 range. Materials in the 1.8 to 2.5 range are also known, but such materials have had associated therewith severe processing, cost and materials problems.

The lowest possible, or ideal, dielectric constant is 1.0, which is the dielectric constant of a vacuum. Air is almost as good with a dielectric constant of 1.001. With this recognition of the low dielectric constant of air, attempts have been made to fabricate semiconductor devices with air gaps between metal leads to reduce the capacitive coupling between the electrically conducting members. The air gap forming techniques that have been developed have varying degrees of complexity.

U.S. Pat. No. 4,987,101 describes a method and structure for providing an insulating electrical space between two lines on a layer of material or between lines on adjacent superposed layers of material. A base member is formed having a plurality of support members extending upwardly from the base member. A removable material is deposited on the base member and around the support members. A cap member of insulating material is then disposed over said support members and the removable material. Access openings are formed in at least one of the base member or the cap member communicating with the removable material. The removable material is removed through the access openings to thereby define a space between the cap member and the base member and between the support members. During this step a partial vacuum (in which some inert gas may be dispersed) may be created in the space vacated by the removable material. The access openings are then filled in so as to provide a sealed space between the cap member and the base member which has a very low dielectric constant.

U.S. Pat. No. 5,324,683 describes several techniques for forming air gaps or regions in a semiconductor device. The air regions are formed by either selectively removing a sacrificial spacer or by selectively removing a sacrificial layer. The air regions are sealed, enclosed or isolated by either a selective growth process or by a non-conformal deposition technique. The air regions may be formed under any pressure, gas concentration or processing condition.

The techniques disclosed in the aforesaid patents rely on holes or other passageways for effecting removal of the sacrificial material. In U.S. Pat. No. 5,461,003, a sacrificial material is removed through a porous dielectric layer. According to this patent, metal leads are formed on a substrate, after which a disposable solid layer is deposited on the metal leads and substrate. The disposable solid layer is then etched back to expose the tops of the metal leads. Then a porous dielectric layer is deposited over the metal leads and disposable layer. This is followed by removal of the disposable layer which is said to be preferably accomplished by exposing the device to oxygen or oxygen-plasma at a high temperature (>100° C.) to vaporize, or burn off, the disposable layer. The oxygen moves through the porous dielectric layer to reach and react with the disposable layer and thereby convert it to a gas that moves back out of the porous dielectric layer. Upon removal of the disposable layer, air gaps are left to provide a low dielectric constant. Finally, a non-porous dielectric layer is deposited on top of the porous dielectric layer to seal the porous dielectric layer from moisture, provide improved structural support and thermal conductivity, and passivate the porous dielectric layer. This procedure results in an air gap that does not extend the full height of the adjacent metal leads or lines. The '003 patent discloses a modified method to remedy this and increase the process margin. This modified method involves a further process step wherein an oxide layer is formed on top of the metal leads so that the disposable dielectric layer can extend higher than the metal leads.

It is also noted that the exposure of the device to an oxygen plasma which must diffuse through a porous layer is not only inefficient, it also exposes other elements of the device to a potentially damaging oxygen plasma for an extended period of time. In particular, exposure of oxygen plasma to copper lines can prove deleterious. Copper is becoming an increasingly important metal in semiconductor manufacturing due to its lower resistivity when compared to aluminum.

WO 98/32169 describes a method of forming an air gap or gaps within solid structures and specifically semiconductor structures to reduce capacitive coupling between electrical elements such as metal lines. According to WO 98/32169 a method of forming an air gap in a semiconductor structure comprises the steps of (i) using a norbornene-type polymer as a sacrificial material to occupy a closed interior volume in a semiconductor structure; (ii) causing the sacrificial material to decompose (preferably self-decompose upon thermal treatment) into one or more gaseous decomposition products; and (iii) removing at least one of the one or more gaseous decomposition products by passage through at least one solid layer contiguous to the interior volume. The decomposition of the sacrificial material leaves an air gap at the closed interior volume previously occupied by the norbornene-type polymer.

WO 98/32169 further describes that the solid layer is a dielectric material through which at least one of the one or more gaseous decomposition products can pass by diffusion under conditions not detrimental to the semiconductor structure. Finally, WO 98/32169 also discloses production methods which can utilize a wide range of sacrificial materials instead of only a norbornene-type polymer.

SUMMARY OF THE INVENTION

The present invention provides a method of forming an air gap or gaps (or multi level structures having such gaps) within solid structures and specifically semiconductor structures to reduce capacitive coupling between electrical elements such as metal lines. Also disclosed is a method which enables the production of overcoated conductive lines or leads. Such methods overcome one or more of the drawbacks associated with the aforesaid prior attempts to reduce capacitive coupling in semiconductor structures such as integrated circuits and packages.

For example, in some instances it is advantageous to utilize a sacrificial material which is less costly, easier to process or "work" with, and has a lower decomposition temperature. The present invention provides such advantages via methods which enable to formation and/or production of structures having air gaps produced utilizing polycarbonates and/or polymethyl methacrylates.

According to one aspect of the invention, a method of forming an air gap within a semiconductor structure comprises the steps of: (i) using a sacrificial material to occupy a closed interior volume in a semiconductor structure; (ii) causing the sacrificial material to decompose into one or more gaseous decomposition products; and (iii) removing at least one of the one or more gaseous decomposition products by passage through at least one solid layer contiguous to the interior volume, wherein the decomposition of the sacrificial material leaves an air gap at the closed interior volume previously occupied thereby, and the sacrificial material comprises a polymer composition selected from one or more polycarbonate polymers, polyester polymers, polyether polymers, methacrylate polymers, acrylate polymers, or mixtures thereof.

In accordance with another aspect of the invention, a method of forming one or more air gaps in a semiconductor structure comprises the steps of: (I) forming a patterned layer of sacrificial material on a substrate corresponding to a pattern of one or more gaps to be formed in the semiconductor structure; (II) depositing a second material on the substrate within regions bordered by the sacrificial material; (III) forming an overcoat layer of material overlying the patterned layer of sacrificial material and second material in the regions bordered by the sacrificial material; (IV) causing the sacrificial material to decompose into one or more gaseous decomposition products; and (V) removing at least one of the one or more gaseous decomposition products by passage through the overcoat layer so that one or more air gaps are formed within the semiconductor structure, wherein the sacrificial material is a polymer composition selected from one or more polycarbonate polymers, polyester polymers, polyether polymers, methacrylate polymers, acrylate polymers, or mixtures thereof.

In accordance with another aspect of the invention, a method of forming air gaps within a semiconductor structure comprises the steps of: using at least one sacrificial material to occupy simultaneously or sequentially at least two closed interior volumes in a semiconductor structure, wherein the at least two closed interior volumes are on different levels of the semiconductor structure; causing the at least one sacrificial material occupying the at least two closed interior volumes to decompose either simultaneously or sequentially into one or more gaseous decomposition products; and removing at least one of the one or more gaseous decomposition products by passage through at least one solid layer contiguous to the interior volume.

In accordance with another aspect of the invention, a method of forming one or more air gaps in a semiconductor structure comprises the steps of: (A) forming a patterned layer of a first sacrificial material on one side of a substrate corresponding to a pattern of one or more gaps to be formed in the semiconductor structure; (B) depositing a second material on the substrate within regions bordered by the first sacrificial material; (C) forming a first overcoat layer of material overlying the patterned layer of the first sacrificial material and the second material in the regions bordered by the first sacrificial material; (D) causing the first sacrificial material to decompose into one or more gaseous decomposition products; (E) removing at least one of the one or more gaseous decomposition products by passage through the first overcoat layer so that one or more air gaps are formed within the semiconductor structure; (F) forming a patterned layer of a second sacrificial material on the first overcoat layer corresponding to a pattern of one or more gaps to be formed in the semiconductor structure; (G) depositing a third material on the first overcoat layer substrate within regions bordered by the second sacrificial material; (H) forming a second overcoat layer of material overlying the patterned layer of the second sacrificial material and the third material in the regions bordered by the second sacrificial material; (I) causing the second sacrificial material to decompose into one or more gaseous decomposition products; and (J) removing at least one of the one or more gaseous decomposition products by passage through the overcoat layers so that one or more air gaps are formed within the semiconductor structure, wherein the first and second sacrificial materials are independently selected from one or more polycarbonate polymers, polyester polymers, polyether polymers, methacrylate polymers, acrylate polymers, or mixtures thereof.

In accordance with another aspect of the invention, a method of forming one or more air gaps in a semiconductor structure comprises the steps of: (A) forming a patterned layer of a first sacrificial material on one side of a substrate corresponding to a pattern of one or more gaps to be formed in the semiconductor structure; (B) depositing a second material on the substrate within regions bordered by the first sacrificial material; (C-1) forming a first overcoat layer of material overlying the patterned layer of the first sacrificial material and the second material in the regions bordered by the first sacrificial material; (C-2) forming a patterned layer of a second sacrificial material on the first overcoat layer corresponding to a pattern of one or more gaps to be formed in the semiconductor structure; (C-3) depositing a third material on the first overcoat layer within regions bordered by the second sacrificial material; (C-4) forming a second overcoat layer of material overlying the patterned layer of the second sacrificial material and the third material in the regions bordered by the second sacrificial material; (D') causing the first and second sacrificial materials to decompose into one or more gaseous decomposition products; and (E') removing at least one of the one or more gaseous decomposition products by passage through the overcoat layers so that one or more air gaps are formed within the semiconductor structure, wherein the first and second sacrificial materials are independently selected from one or more norbornene polymers, polycarbonate polymers, polyester polymers, polyether polymers, methacrylate polymers, acrylate polymers, or mixtures thereof.

In accordance with another aspect of the invention, a method of forming one or more air gaps in a semiconductor structure comprises the steps of: using a sacrificial material to occupy at least one first closed interior volume in a semiconductor structure and using a conductive material to occupy at least one second closed interior volume in a semiconductor structure, the at least one first closed interior volume and the at least one second closed interior volume defining at least one gap therebetween; forming an overcoat layer of material on the sacrificial material and the conductive material with the overcoat material extending into the at least one gap; causing the sacrificial material to decompose into one or more gaseous decomposition products; and removing at least one of the one or more gaseous decomposition products by passage through the first overcoat layer so that one or more air gaps are formed within the semiconductor structure, thereby yielding overcoated conductive structures.

According to yet another aspect of the invention, a semiconductor device having at least one air gap therein comprises: a substrate; at least one conductive line or lead; at least one air gap; and an overcoat layer, wherein the at least one air gap is produced in accordance with any one of the methods disclosed herein.

According to yet another aspect of the invention, a semiconductor structure comprises: a substrate; a sacrificial material supported on the substrate; a conductive material supported on the substrate and spaced apart from the sacrificial material; an overcoat layer overcoating the sacrificial material and the conductive material and extending into the one or more spaces between the sacrificial material and the conductive material.

According to yet another aspect of the invention, a semiconductor structure comprises: a substrate; a sacrificial material supported on the substrate; a conductive material supported on the substrate and spaced apart from the sacrificial material; an overcoat layer overcoating the sacrificial material and the conductive material and extending into the one or more spaces between the sacrificial material and the conductive material, wherein the sacrificial material has been removed by decomposition through the overcoat layer.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1A:
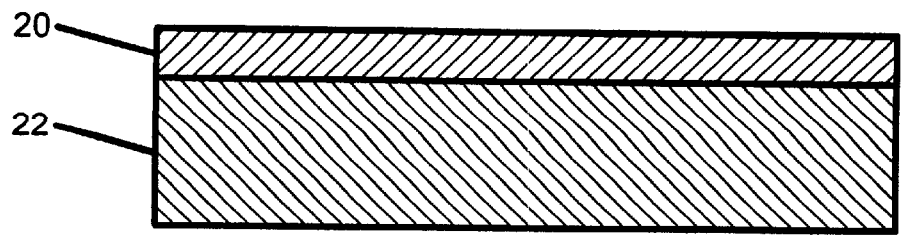
FIGS. 1A–1D are diagrammatic cross-sections of a portion of a semiconductor structure, illustrating several steps of a method according to one aspect of the invention.
Figure 1B:
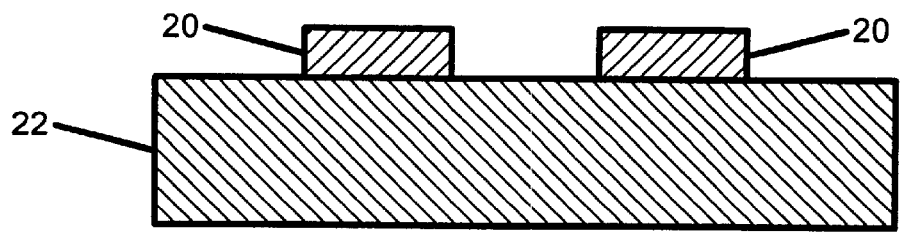
Figure 1C:
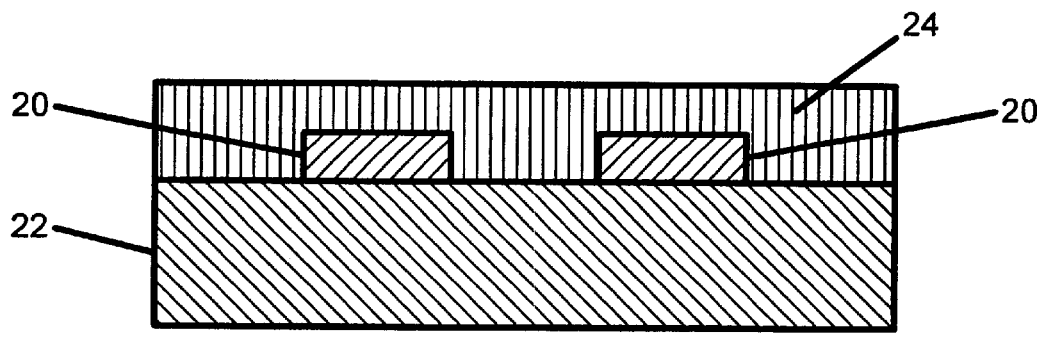
Figure 1D:
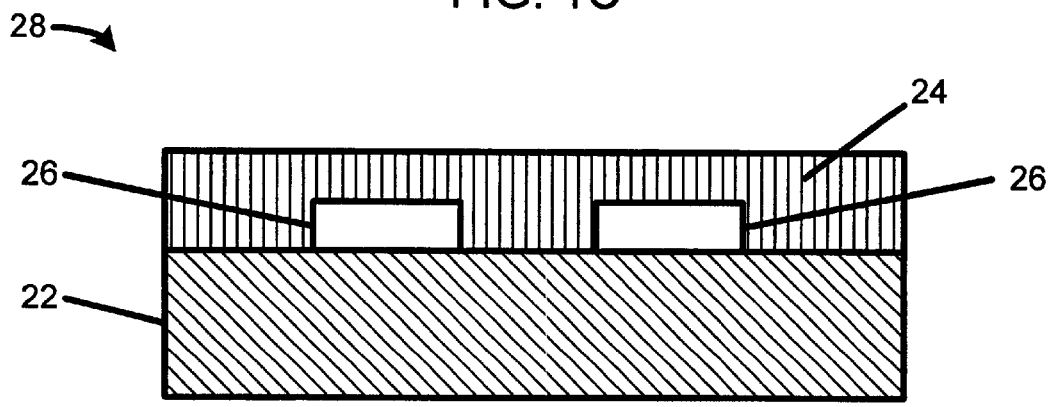

Referring now in detail to the drawings, the various steps of a method of producing a structure according to one aspect of the invention are diagrammatically illustrated in FIGS. 1A–1D. In FIGS. 1A and 1B, a patterned layer of sacrificial material 20 is formed on a substrate 22 by any suitable technique. This may be accomplished, for example, by first forming a layer of the sacrificial material 20 on the substrate 22 as depicted in FIG. 1A and then patterning the layer, for example by etching or any other suitable technique, to form the patterned layer of sacrificial material 20 having one or more "hills" formed by the sacrificial material on the substrate with "valleys" formed between any two relatively adjacent hills. A second solid layer of a non-sacrificial material 24 is then formed on the patterned layer in overlying relation to the patterned layer 20 as depicted in FIG. 1C. Then, heat is applied to the decompose the sacrificial material into one or more gaseous decomposition products, and one or more of these decomposition products are removed by passing through the second layer 24. This provides an air-gap structure 28 having one or more air gaps 26 in the closed interior space or spaces previously occupied by the sacrificial material 20.

Generally, an air-gap structure is formed by using two dielectric materials, a sacrificial material which decomposes to gaseous products and a permanent material (at least permanent for purposes of forming the interior air gap or gaps) which forms a cover or overcoat through which one or more of the gaseous products can pass. In one embodiment, such passage is by diffusion of one or more of the decomposition products through the overcoat material. Reference herein is made to passage of the decomposition products of the sacrificial layer through the permanent layer. This broadly is intended to encompass passage in any manner, including though holes or passages in the permanent layer that may later be closed. However, in one embodiment, passage is by diffusion through a solid permanent layer.

In one embodiment, the decomposition reaction of the sacrificial material is induced solely by high temperature although other means may be used. The decomposition temperature should be compatible with the various components of the structure so as not to destroy the integrity thereof aside from the removal of the sacrificial material to form the air gap or gaps. Typically, such temperature should be less than about 500° C. for electrical interconnect devices. In another embodiment, such a temperature is less than about 450° C. It is contemplated that, in one embodiment, the decomposition temperature will fall in the range of about 380° C. to about 450° C., although materials having decomposition temperatures as low as about 150° C. may be beneficial. The sacrificial material, however, should be sufficiently thermally stable so that the permanent material can be processed to a condition where it is electrically and/or mechanically stable.

It should be further noted that any one or more of the herein described layers may be composed of multiple sub-layers, as may desired for different fabricating techniques. For example, the layer 24 in FIG. 1C may be composed of a first sub-layer at the same level as the sacrificial layer and a second sub-layer overlying the first sub-layer and the sacrificial material. Also, the indication that a layer is applied to an underlying layer does is not intended to preclude the presence of an intermediate layer that might be employed, for example, to enable bonding of one layer to another.

In one embodiment, the sacrificial material for carrying out the above-described method is selected from the cycloolefin class of compounds. In another embodiment, the sacrificial material is a bicycloolefin. In still another embodiment, the sacrificial material is a norbornene polymer. By norbornene polymer is meant polycyclic addition homopolymers and copolymers comprising repeating units set forth under Formulae I, II and III below. Copolymers useful in practicing the invention can include repeating units selected from the group comprising and/or consisting of Formulae I, II and III, or combinations thereof. As would be appreciated by one of ordinary skill in the art, the above definition includes therein those norbornene polymers which are functionally equivalent to the polymers set forth in Formulae I, II and III. One such type of norbornene 30 polymer that is useful as the sacrificial material in the present invention is sold under the Avatrel® trademark by The BF Goodrich Company, Akron, Ohio. The polymer comprises silyl substituted repeating units represented by the structure set forth under Formula I below.

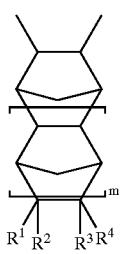

I wherein $R^1$ and $R^4$ independently represent hydrogen; linear or branched ($C_1$ to $C_{20}$) alkyl; $R^2$ and $R^3$ independently represent hydrogen, linear or branched ($C_1$ to $C_{20}$) alkyl or the group:

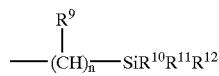

Ia $R^9$ independently is hydrogen, methyl, or ethyl; $R^{10}$, $R^{11}$, and $R^{12}$ independently represent linear or branched ($C_1$ to $C_{20}$) alkyl, linear or branched ($C_1$ to $C_{20}$) alkoxy, linear or branched ($C_1$ to $C_{20}$) alkyl carbonyloxy (e.g., acetoxy), and substituted or unsubstituted ($C_6$ to $C_{20}$) aryloxy; m is a number from 0 to 4; and n is a number from 0 to 5. In Formula I at least one of substituents $R^2$ and $R^3$ must be selected from the silyl group represented by the formula set forth under Ia.

In one embodiment, at least one of $R^{10}$, $R^{11}$, or $R^{12}$ is selected from a linear or branched ($C_1$ to $C_{10}$) alkoxy group and $R^9$ is hydrogen. In another embodiment, each of $R^{10}$, $R^{11}$, and $R^{12}$ are the same and are selected from methoxy, ethoxy, propoxy, butoxy, and pentoxy. In yet another embodiment, n is 0 and $R^{10}$, $R^{11}$, and $R^{12}$ are each ethoxy groups, e.g., $R^2$ and/or $R^3$ is a triethoxysilyl substituent. When n is 0, it is evident that the silyl functionality is connected directly to the polycyclic ring through a silicon-carbon bond wherein the carbon atom of said silicon-carbon bond is supplied by a carbon atom on the polycyclic ring (i.e., a ring carbon atom).

In Formula I above, m is, in one embodiment, 0 or 1 as represented by structures Ib and Ic, respectively, below:

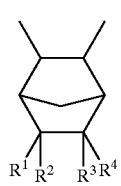

Ib

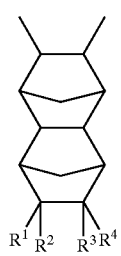

Ic wherein $R^1$ to $R^4$ are as previously defined and at least one of $R^2$ and $R^3$ must be a silyl substituent represented by Ia. In one embodiment, repeating units where m is 0, i.e., repeating units of structure Ib, are utilized.

In Formulae I, Ib, and Ic $R^1$ and $R^4$ can taken together with the two ring carbon atoms to which they are attached to represent a saturated cyclic group of 4 to 8 carbon atoms. When $R^1$ and $R^4$ are taken together to form a saturated cyclic group, the cyclic group is substituted by $R^2$ and $R^3$ at least one of which must be a silyl group represented by Ia. Generically such monomers are represented by the following structure:

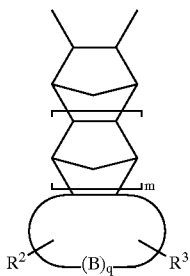

wherein B is a methylene (i.e., —CH$_2$—) group and q is a number from 2 to 6. It should be apparent that when the methylene group represented by B contains an R$^2$ or R$^3$ substituent, one of the hydrogen atoms of the —CH$_2$— group is replaced by the R$^2$ or R$^3$ substituent. Representative repeating unit structures are set forth below:

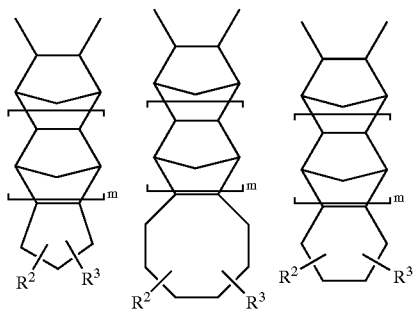

wherein R$^2$, R$^3$, and m are as previously defined.

Illustrative examples of monomers of Formula I include 5-triethoxysilyl-norbornene, 5-trimethylsilyl norbornene, 5-trimethoxysilyl norbornene, 5-methyldimethoxysilyl norbornene, 5-dimethylmethoxy norbornene.

In another embodiment of the present invention, the sacrificial polymer comprises hydrocarbyl substituted polycyclic repeating units selected from units represented by Formula II below:

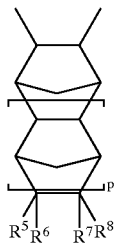

II wherein R$^5$, R$^6$, R$^7$, and R$^8$ independently represent hydrogen, linear and branched (C$_1$ to C$_{20}$) alkyl, hydrocarbyl substituted and unsubstituted (C$_5$ to C$_{12}$) cycloalkyl, hydrocarbyl substituted and unsubstituted (C$_6$ to C$_{40}$) aryl, hydrocarbyl substituted and unsubstituted (C$_7$ to C$_{15}$) aralkyl, (C$_3$ to C$_{20}$) alkynyl, linear and branched (C$_3$ to C$_{20}$) alkenyl, or vinyl; any of R$^5$ and R$^5$ or R$^7$ and R$^8$ can be taken together to form a (C$_1$ to C$_{10}$) alkylidenyl group, R$^5$ and R$^6$ when taken with the two ring carbon atoms to which they are attached can represent saturated and unsaturated cyclic groups containing 4 to 12 carbon atoms or an aromatic ring containing 6 to 17 carbon atoms; and p is 0, 1, 2, 3, or 4. The hydrocarbyl substituents on the foregoing substituents are composed solely of carbon and hydrogen atoms, such as, for example, branched and unbranched (C$_1$ to C$_{10}$) alkyl, branched and unbranched (C$_2$ to C$_{10}$) alkenyl, and (C$_6$ to C$_{20}$) aryl.

Illustrative examples of hydrocarbyl substituted monomers include, but are not limited to, 2-norbornene, 5-methyl-2-norbornene, 5-hexyl-2-norbornene, 5-cyclohexyl-2-norbornene, 5-cyclohexenyl-2-norbornene, 5-butyl-2-norbornene, 5-ethyl-2-norbornene, 5-decyl-2-norbornene, 5-phenyl-2-norbornene, 5-naphthyl-2-norbornene 5-ethylidene-2-norbornene, vinylnorbornene, dicyclopentadiene, dihydrodicyclopentadiene, tetracyclododecene, methyltetracyclododecene, tetracyclododecadiene, dimethyltetracyclododecene, ethyltetracyclododecene, ethylidenyl tetracyclododecene, phenyltetra-cyclododecene, trimers of cyclopentadiene (e.g., symmetrical and asymmetrical trimers). In one embodiment, the hydrocarbyl repeating unit is derived from 2-norbornene.

In another embodiment of the invention, a sacrificial polymer useful in carrying out the invention comprises repeating units represented by Formula III below:

III

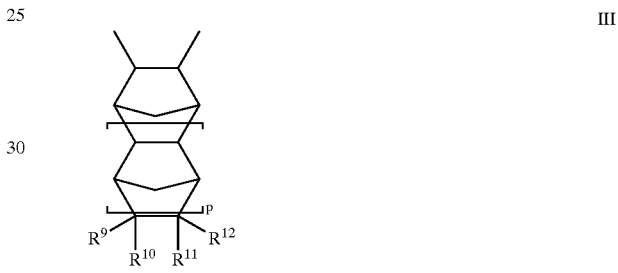

wherein R$^9$ to R$^{12}$ independently represent a polar substituent selected from the group: —(A)$_n$—C(O)OR", —(A)$_n$—OR", —(A)$_n$—OC(O)R", —(A)$_n$—OC(O)OR", —(A)$_n$—C(O)R", —(A)$_n$—OC(O)C(O)OR", —(A)$_n$—O—A'—C(O)OR", —(A)$_n$—OC(O)—A'—C(O)OR", —(A)$_n$—C(O)O—A'—C(O)OR", —(A)$_n$—C(O)—A'—OR", —(A)$_n$—C(O)O—A'—OC(O)OR", —(A)$_n$—C(O)O—A'—O—A'—C(O)OR", —(A)$_n$—C(O)O—A'—OC(O)C(O)OR", —(A)$_n$—C(R")$_2$CH(R")(C(O)OR"), and —(A)$_n$—C(R")$_2$CH(C(O)OR")$_2$; and p is 0, 1, 2, 3, 4, or 5. The moieties A and A' independently represent a divalent bridging or spacer group selected from divalent hydrocarbon groups, divalent cyclic hydrocarbon groups, divalent oxygen containing groups, and divalent cyclic ethers and cyclic diethers, and n is an integer 0 or 1. When n is 0 it should be apparent that A and A' represent a single covalent bond. By divalent is meant that a free valence at each terminal end of the group are attached to two distinct groups. The divalent hydrocarbon groups can be represented by the formula —(C$_d$H$_{2d}$)— where d represents the number of carbon atoms in the alkylene chain and is an integer from 1 to 10. In one embodiment, the divalent hydrocarbon groups are selected from linear and branched (C$_1$ to C$_{10}$) alkylene such as methylene, ethylene, propylene, butylene, pentylene, hexylene, heptylene, octylene, nonylene, and decylene. When branched alkylene groups are contemplated, it is to be understood that a hydrogen atom in the linear alkylene chain is replaced with a linear or branched (C$_1$ to C$_5$) alkyl group.

The divalent cyclic hydrocarbon groups include substituted and unsubstituted (C$_3$ to C$_8$) cycloaliphatic moieties represented by the formula:

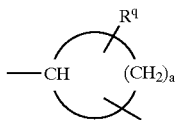

wherein a is an integer from 2 to 7 and $R^q$ when present represents linear and branched ($C_1$ to $C_{10}$) alkyl groups. Divalent cycloalkylene groups include, but are not limited to, cyclopentylene and cyclohexylene moieties represented by the following structures:

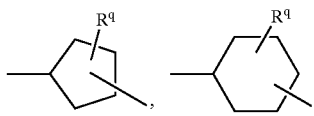

wherein $R^q$ is defined above. As illustrated here and throughout this specification, it is to be understood that the bond lines projecting from the cyclic structures and/or formulae represent the divalent nature of the moiety and indicate the points at which the carbocyclic atoms are bonded to the adjacent molecular moieties defined in the respective formulae. As is conventional in the art, the diagonal bond line projecting from the center of the cyclic structure indicates that the bond is optionally connected to any one of the carbocyclic atoms in the ring. It is also to be understood that the carbocyclic atom to which the bond line is connected will accommodate one less hydrogen atom to satisfy the valence requirement of carbon.

Exemplary divalent cyclic ethers and diethers are represented by, but not limited to, the structures:

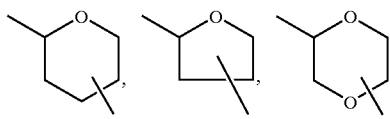

The divalent oxygen containing groups include ($C_2$ to $C_{10}$) alkylene ethers and polyethers. By ($C_2$ to $C_{10}$) alkylene ether is meant that the total number of carbon atoms in the divalent ether moiety must at least be 2 and can not exceed 10. The divalent alkylene ethers are represented by the formula -alkylene-O-alkylene- wherein each of the alkylene groups that are bonded to the oxygen atom can be the same or different and are selected from methylene, ethylene, propylene, butylene, pentylene, hexylene, heptylene, octylene, and nonylene. The simplest divalent alkylene ether of the series is the group —$CH_2$—O—$CH_2$—. Polyether moieties include, but are not limited to, divalent groups of the formula:

wherein x is an integer from 0 to 5 and y is an integer from 2 to 50 with the proviso that the terminal oxygen atom on the polyether spacer moiety can not be directly linked to a terminal oxygen atom on an adjacent group to form a peroxide linkage. In other words, peroxide linkages (i.e., —O—O—) are not contemplated when polyether spacers are linked to any of the terminal oxygen containing substituent groups set forth under $R^9$ to $R^{12}$ above.

$R^9$ to $R^{12}$ can also independently represent hydrogen, linear and branched ($C_1$ to $C_{10}$) alkyl, so long as at least one of the remaining $R^9$ to $R^{12}$ substituents is selected from one of the polar groups represented above. As is noted with regard to Formula III, p is an integer from 0 to 5 (in one embodiment 0 or 1, in another embodiment 0). R″ independently represents hydrogen, linear and branched ($C_1$ to $C_{10}$) alkyl (e.g., —$C(CH_3)$), —$Si(CH_3)$, —$CH(R^p)OCH_2CH_3$, —$CH(R^p)OC(CH_3)_3$, linear and branched ($C_1$ to $C_{10}$) alkoxyalkylene, polyethers, monocyclic and polycyclic ($C_4$ to $C_{20}$) cycloaliphatic moieties, cyclic ethers, cyclic ketones, and cyclic esters (lactones). By ($C_1$ to $C_{10}$) alkoxyalkylene is meant that a terminal alkyl group is linked through an ether oxygen atom to an alkylene moiety. The group is a hydrocarbon based ether moiety that can be generically represented as -alkylene-O-alkyl wherein the alkylene and alkyl groups independently contain 1 to 10 carbon atoms each of which can be linear or branched. The polyether group can be represented by the formula:

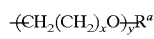

wherein x is an integer from 0 to 5, y is an integer from 2 to 50 and $R^a$ represents hydrogen or linear and branched ($C_1$ to $C_{10}$) alkyl. Polyether groups include, but are not limited to, poly(ethylene oxide) and poly(propylene oxide). Examples of monocyclic cycloaliphatic monocyclic moieties include cyclopropyl, cyclobutyl, cyclopentyl, cyclohexyl, dicyclopropylmethyl (Dcmp) and dimethylcyclopropylmethyl (Dmcp), and the like. Examples of cycloaliphatic polycyclic moieties include, but are not limited to, norbornyl, adamantyl, tetrahydrodicyclopentadienyl (tricyclo[5.2.1.0$^{2,6}$] decanyl), and the like. Examples of cyclic ethers include, but are not limited to, tetrahydrofuranyl and tetrahydropyranyl moieties. An example of a cyclic ketone is a 3-oxocyclohexanonyl moiety. An example of a cyclic ester or lactone is a mevalonic lactonyl moiety. Structures for representative cyclic groups set forth above include:

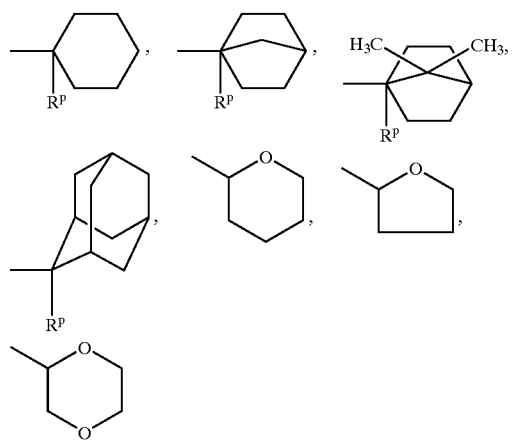

wherein $R^p$ in the above formulae and cyclic groups represents hydrogen or a linear or branched ($C_1$ to $C_5$) alkyl group. The Dcpm and Dmcp substituents are represented, respectively, as follows:

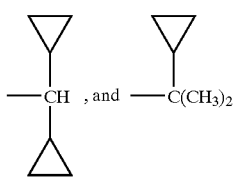

In one embodiment, the sacrificial polymers useful in practicing the present invention encompass homopolymers and copolymers containing random repeating units derived from a monomer unit or monomer units represented by Formula I, or homopolymers or copolymers containing random repeating units derived from monomer unit or units represented by Formula II, homopolymers or copolymers containing repeating units derived from a monomer unit(s) represented by Formula III and copolymers comprising a combination of repeating units represented by Formulae I and II, Formulae I and III, Formulae II and III or Formulae I, II and III.

In one embodiment, the sacrificial polymers according to the present invention can contain from about 0.1 to 100 mole percent of silyl functional polycyclic repeating units, with the remainder of the polymer comprising repeating units described under Formula II and/or Formula III. In another embodiment, the sacrificial polymers according to the present invention can contain from about 1 to 50 mole percent, with the remainder of the polymer comprising repeating units described under Formula II and/or Formula III. In yet another embodiment, the sacrificial polymers according to the present invention can contain from about 3 to 25 mole percent, with the remainder of the polymer comprising repeating units described under Formula II and/or Formula III. In yet another embodiment, the sacrificial polymers according to the present invention can contain from about 5 to 20 mole percent, with the remainder of the polymer comprising repeating units described under Formula II and/or Formula III. In yet another embodiment, the sacrificial polymer comprises repeating units polymerized from norbornene and triethoxysilyl-norbornene in a mole percent ratio of 80/20 norbornene/triethoxysilyinorbonene.

The sacrificial polymers according to present invention can be addition polymers comprising polycyclic repeating units that are connected to one another via 2,3-linkages that are formed across the double bond contained in the norbornene moiety of the prepolymerized polycyclic monomer.

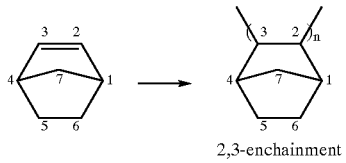

2,3-enchainment

The polymers may be polymerized from appropriately functionalized norbornene monomers in the presence of a single or multi-component Group VIII transition metal catalyst system as described in International Patent Application Publication No. WO 97/20871 to The BFGoodrich Company, published on Jun. 12, 1997, which is hereby incorporated herein by reference in its entirety.

The polynorbornene polymers are useful because they have a high (>350° C.) and sufficient thermal stability to accommodate a number of commonly employed and other semiconductor manufacturing steps such as plasma enhanced chemical vapor deposition (PECVD) of $SiO_2$ and low temperature copper annealing, and has a decomposition temperature close to its $T_g$, thereby limiting movement which might damage the semiconductor device.

In another embodiment, the sacrificial polymer is a polycarbonate polymer containing repeating units according to the following general formula of:

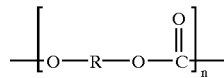

where R represents linear and branched ($C_1$ to $C_{20}$) alkyl, hydrocarbyl substituted and unsubstituted ($C_5$ to $C_{12}$) cycloalkyl, hydrocarbyl substituted and unsubstituted ($C_6$ to $C_{40}$) aryl, hydrocarbyl substituted and unsubstituted ($C_7$ to $C_{15}$) aralkyl, ($C_3$ to $C_{20}$) alkynyl, linear and branched ($C_3$ to $C_{20}$) alkenyl and n is equal to 2 to about 100,000. In another embodiment, n is equal to 2 to about 10,000. In yet another embodiment, n is equal to 2 to about 1,000.

In another embodiment, the sacrificial polymer is a polyester polymer containing repeating units according to the following general formula of:

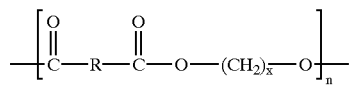

where R represents linear and branched ($C_1$ to $C_{20}$) alkyl, hydrocarbyl substituted and unsubstituted ($C_1$ to $C_{12}$) cycloalkyl, hydrocarbyl substituted and unsubstituted ($C_6$ to $C_{40}$) aryl, hydrocarbyl substituted and unsubstituted ($C_7$ to $C_{15}$) aralkyl, ($C_3$ to $C_{20}$) alkynyl, linear and branched ($C_3$ to $C_{20}$) alkenyl; x is an integer from 1 to about 20; and n is equal to 2 to about 100,000. In another embodiment, x is an integer from 1 to about 10 and n is equal to 2 to about 10,000. In yet another embodiment, x is an integer from 1 to about 6 and n is equal to 2 to about 1,000.

In another embodiment, the sacrificial polymer is a polyether polymer containing repeating units according to the following general formula of:

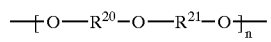

where $R^{20}$ and $R^{21}$ independently represent linear and branched ($C_1$ to $C_{20}$) alkyl, hydrocarbyl substituted and unsubstituted ($C_5$ to $C_{12}$) cycloalkyl, hydrocarbyl substituted and unsubstituted ($C_6$ to $C_{40}$) aryl, hydrocarbyl substituted and unsubstituted ($C_7$ to $C_{15}$) aralkyl, ($C_3$ to $C_{20}$) alkynyl, linear and branched ($C_3$ to $C_{20}$) alkenyl and n is equal to 2 to about 100,000. In another embodiment, n is equal to 2 to about 10,000. In yet another embodiment, n is equal to 2 to about 1,000.

Such polycarbonates, polyesters and polyethers can be used as sacrificial materials in the present invention because they can be patterned on a device by an appropriate physical or chemical method. For example, reactive ion etching can be used to provide a patterned surface of a polycarbonate polymer. Additionally, laser ablation, wet etching, direct printing, hot embossing, screen printing, pattern printing, and photolithography can be utilized to create or produce a patterned layer of one or more of the above-mentioned sacrificial materials.

In one embodiment, the polycarbonate sacrificial polymer of the present invention is selected from polyethylene carbonate (PEC) and polyprolylene carbonate.

In another embodiment, the sacrificial polymer of the present invention can be a methacrylate or acrylate polymer. In one embodiment, the methacrylate polymer is a polymethyl methacrylate polymer.

In one embodiment, the methacrylate or acrylate polymer of the present invention has a molecular weight of about 1,000 to about 1,000,000. In another embodiment, the methacrylate or acrylate polymer of the present invention has a molecular weight of about 10,000 to about 500,000. In another embodiment, the methacrylate or acrylate polymer of the present invention has a molecular weight of about 100,000 to about 250,000.

In another embodiment, the sacrificial polymer utilized in practicing this invention is a negative or positive photosensitive sacrificial material. The photo-sensitive property of such a polymer can either be inherent in the sacrificial material utilized or can be conferred thereto by the addition of one or more photo-sensitive materials.

It is believed that the sacrificial polymers utilized in practicing this invention are suited as sacrificial materials in semiconductor device manufacturing because the material thermally decomposes close to its $T_g$. In other words, the polymer remains mechanically stable until the decomposition temperature is reached enabling the polymer to endure the rather harsh processing steps (e.g., repeated heat cycles) during semiconductor manufacture. The disadvantage with the prior art polymers is that their $T_g$'s are well below their decomposition temperatures, leading to mechanical failure before the decomposition temperature is reached.

With regard to the polycycloolefinic sacrificial polymer materials, it has been found that by incorporating polycycloolefinic repeating units that contain pendant hydrocarbyl (Formula II) and/or pendant polar (Formula III) substituents into the sacrificial polymer backbone the decomposition temperatures of the silyl substituted polycycloolefinic polymer can be significantly lowered. The decomposition temperature of polymers containing 80/20 mole percent of norbornene/triethoxysilyinorbornene (approximately 430° C.) can be lowered by approximately 30° C. by replacing the norbornene repeating units in the copolymer with repeating units containing pendant linear and/or branched ($C_1$ to $C_{20}$) alkyl substituents. For example, the thermal decomposition temperature for a copolymer containing butylnorbornene/triethoxysilylnorbornene in a mole percent ratio of 95/5 is lowered to 405° C. We expect that the decomposition temperature of the copolymer can be lowered even further (up to approximately 100° C.) by replacing the norbornene repeating units in the copolymer with repeating units containing the polar substituents described under Formula III. Homopolymers of norbornyl acetate and norbornyl ethyl carbonate have thermal decomposition temperatures of 356° C. and 329° C., respectively. The polar groups include ester, carbonate, and acetate substituents and the like. To effect lower decomposition temperatures of the silyl substituted polymers, the polymer should contain about 50 mole percent of polycyclic repeating units having pendant hydrocarbyl or polar functionality. In another embodiment, the polymer should contain greater than 50 mole percent of polycyclic repeating units having pendant hydrocarbyl or polar functionality. In yet another embodiment, the polymer should contain about 51 to about 99 mole percent of polycyclic repeating units having pendant hydrocarbyl or polar functionality. In still another embodiment, the polymer should contain about 65 to about 80 mole percent of polycyclic repeating units having pendant hydrocarbyl or polar functionality.

The aforesaid sacrificial polymers can be heated to above their decomposition temperature, typically in the range of about 380° C. to about 450° C., to cause the polymers to decompose into their decomposition products which can diffuse through various materials used to form semiconductor devices including air gaps. The materials include polymer dielectrics such as silicon dioxide, silicon nitride, silicon oxynitride, polyarylene ether, spin-on-glasses (e.g., methylsilsesquioxane (MSQ), hydrogen-silsesquioxane (HSQ), or a mixed silsesquioxane), and polyimides, for example, Olin-Ciba Geigy (OCG) Probimide® 293 and 412, Amoco Ultradel® 7501 and DuPont Pyralin® 2545, 2611, or 2731. In one embodiment, the dielectric polymer used in the present invention is photosensitive.

The forgoing methodology can be applied to form air gaps in a variety of electrical devices and particularly in relation to electrical interconnects in integrated circuits and other electronic packages. The air gaps may be used on opposite sides of a conductive member or members in both interplanar and intraplanar arrangements to provide a low dielectric insulator with dielectric constants generally less than about 2. In another embodiment, the dielectric constants can be less than about 1.5. In yet another embodiment, the dielectric constants can be less than about 1.25. In still another embodiment, the dielectric constants can be less than about 1.0. The lower the capacitance, the faster the electrical signal can be transmitted through the conductors and the lower the crosstalk between conductors.

The above-mentioned sacrificial polymers are advantageous because generally they leave little or essentially no residue. However, some residue may be desirable. For example, a thin film of $SiO_2$ (or $TiO_2$ if Ti is used in place of Si in the functionalized norbornene) may be left to insulate the electrical conductors or control corrosion. Actual tests have shown about 100 Å of residue when 5 μm of material are decomposed.

Figure 2A:
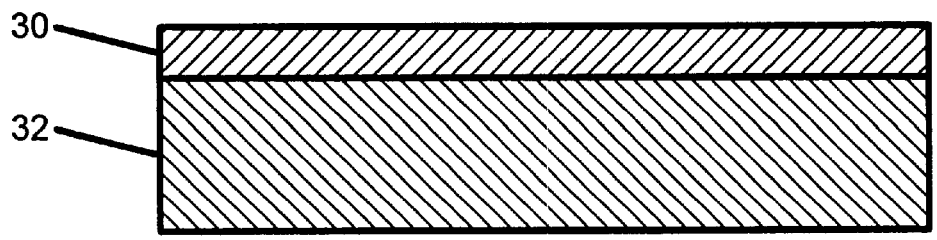
FIGS. 2A–2F are diagrammatic cross-sections of a portion of a semiconductor structure, illustrating several steps of a method according to another aspect of the invention.
Figure 2B:
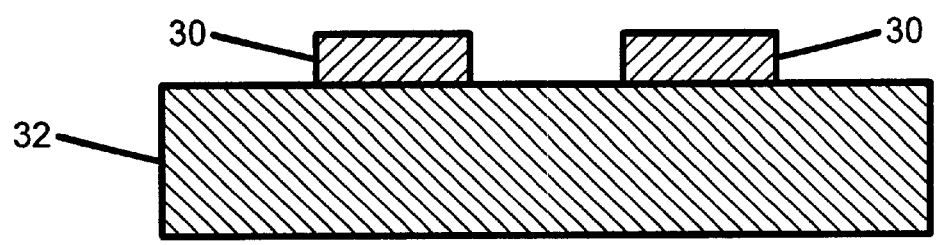

FIGS. 2A–2F illustrate one possible method of forming an air gap or region between two conductive regions or elements, such as metal lines, according to the present invention. In FIGS. 2A and 2B, a patterned layer of sacrificial material 30 is formed on a substrate 32. The substrate 32 may have patterns already on it, or it may be an unpatterned material. The substrate may be a base layer or a layer of material overlying a base layer such as an insulating layer of $SiO_2$ that may overlie the devices on an integrated circuit chip (not shown). By way of specific example, the substrate may be a semiconductor wafer which may, for example, contain transistors, diodes, and other semiconductor elements (as are well known in the art).

As depicted in FIG. 2A, a uniform layer of the sacrificial material 30 is deposited on the substrate 32. This may be done in any suitable manner, for example, by spin coating, spraying, meniscus, extrusion or other coating methods, by pressing or laying a dry film laminate onto the substrate, etc.

In FIG. 2B, the layer of sacrificial material is patterned to produce the patterned layer of the sacrificial material 30, the pattern of which corresponds to the desired pattern of one or more air gaps to be formed in the semiconductor device. Any suitable technique can be used to pattern the layer of sacrificial material, including, for example, laser ablating, etching, etc. The sacrificial material may be of a type that is or may be made photosensitive to facilitate patterning.

Figure 2C:
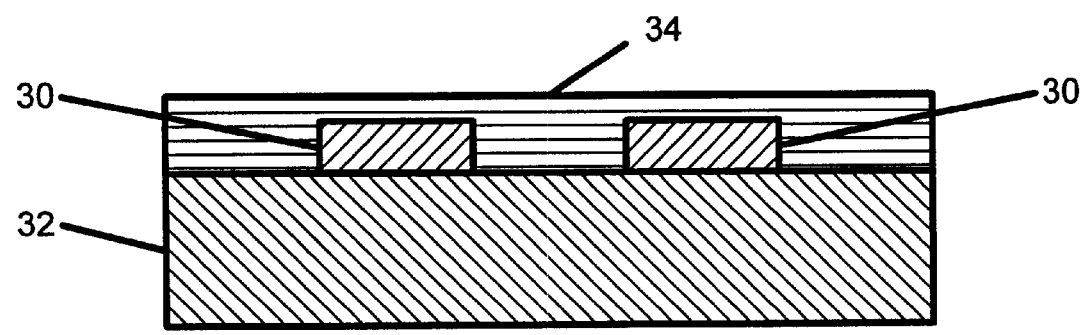

In FIG. 2C, a layer of conductive material 34, (in one embodiment, the conductive material is a metal) is deposited over the patterned layer of sacrificial material 30. This may be done by any suitable technique including, for example, metal sputtering, chemical vapor deposition (CVD), physical vapor deposition (PVD), electroplating, electroless plating, etc.

Figure 2D:
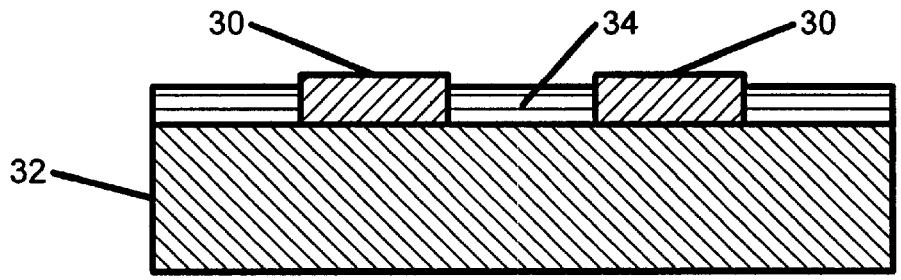

In FIG. 2D, the metal layer 34 is planarized as needed by any suitable technique including, for example, chemical-mechanical polishing (CMP). If CMP is used with the above-described polynorbornene polymer, and other polymers as well, a layer of silicon dioxide can be applied to the surface of the sacrificial layer to provide an etch stop.

Figure 2E:
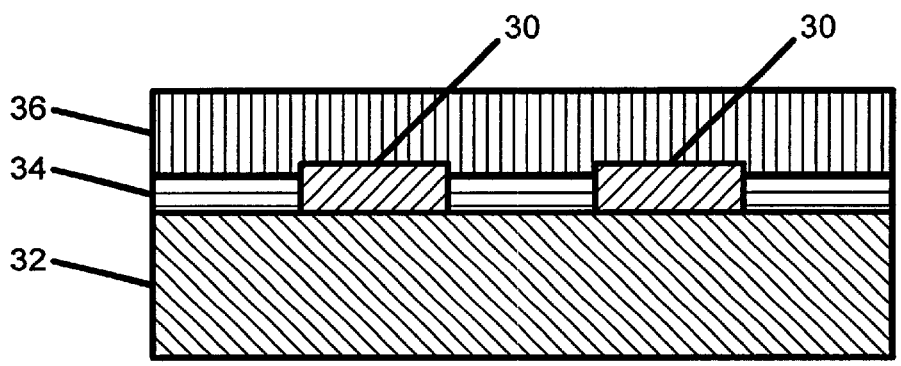

In FIG. 2E, a permanent dielectric 36 is deposited over the patterned layer of sacrificial material 30 with the metal inlay 34. The permanent dielectric 36 is deposited as a solid layer and covers the sacrificial layer 30 and at least the tops of the metal leads 34. The permanent dielectric layer may be planarized before or after removal of the sacrificial material. The permanent dielectric layer, for example, may be silicon dioxide, polyimide or other material. The permanent dielectric layer may be deposited by spin coating, spray coating or meniscus coating (typically using the sacrificial material dissolved in a solvent), chemical vapor deposition, plasma enhanced chemical vapor deposition, sol-gel process, or other method. As seen in FIG. 2E, the metal layer can be conveniently formed with a height less than the height of the adjacent sacrificial material. As will be appreciated, this will result in air gaps that extend above the tops of the metal leads, as is desirable to reduce capacitive coupling. Also, the substrate could have trenches formed therein in a pattern corresponding to the pattern of the sacrificial material, so that the resultant air gaps will extend below the metal leads located on lands on the substrate between the trenches.

Figure 2F:
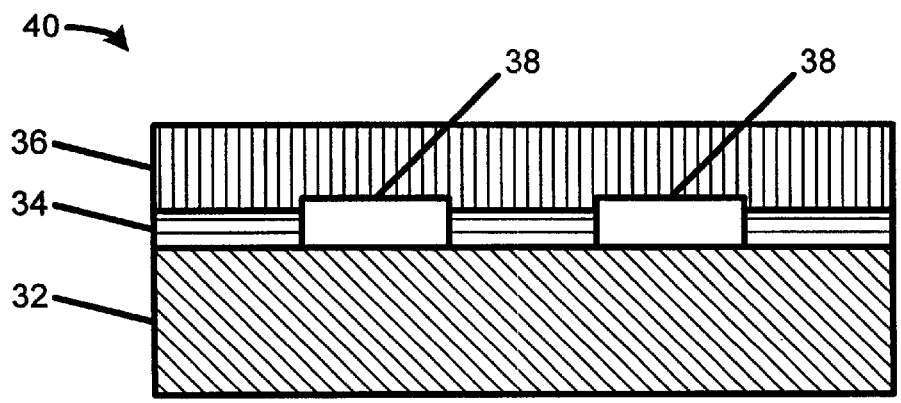

The sacrificial material 30 is removed through the permanent dielectric layer 36 to form the air gaps 38 as shown in FIG. 2F. The removal of the sacrificial material is, in one embodiment, accomplished by thermal decomposition and passage of one or more of the decomposition products through the permanent dielectric layer 36 by diffusion. As above indicated, the sacrificial materials of the present invention will undergo thermal decomposition at temperatures on the order of about 450° C., and lower, with essentially no residue being left in the air gaps of the resultant semiconductor structure 40. Also, the decomposition products are diffusable through many dielectric materials useful forming the permanent dielectric layer, including polyimides.

The rate of decomposition should be slow enough so that diffusion through the permanent dielectric will occur. Diffusion typically arises from a pressure buildup within the air gap. This pressure build up should not be so great as to exceed the mechanical strength of the permanent dielectric. Increased temperature will generally aid diffusion as diffusivity of gas though the permanent dielectric will normally increase with temperature.

In one embodiment, the sacrificial material is decomposed at a relatively slow rate. In one embodiment, the heating rate is between about 0.5 to about 10° C./minute. In another embodiment, the heating rate is between about 1 to about 5° C./minute. In yet another embodiment, the heating rate is between about 2 to about 3° C./minute.

As will be appreciated, the air gaps may contain residual gas although generally the residual gas will eventually exchange with air. However, steps may be taken to prevent such exchange, or dispose a different gas (a noble or inert gas for example) or a vacuum in the air gaps. For example, the semiconductor structure may be subjected to vacuum conditions to extract any residual gas from the air gaps by diffusion or other passage through the overcoat layer 24 or otherwise, after which the semiconductor structure may be coated by a suitable sealing material blocking any further passage of gases through the overcoat layer. Before the semiconductor structure is sealed, it may be subjected to a controlled gas atmosphere, such as one containing an inert gas (e.g., nitrogen), to fill the air gaps with such gas.

In another embodiment, the semiconductor structure can be subjected to the necessary decomposition temperature while contained in an atmosphere which will enable exchange or absorption of one or more reactive molecules into the air gaps formed during decomposition. For example, the semiconductor device can be subjected to decomposition in an oxygen atmosphere or a $SiH_4$. An oxygen atmosphere will, for example, yield hydrophilic air gaps.

As will be appreciated, further processing steps may be performed on the semiconductor structure 40, for example to form additional layer of interconnection in the semiconductor device.

Those skilled in the art will also appreciate that other techniques may be employed to remove the sacrificial material, although less desirable and/or dictated by the type of sacrificial material utilized. The sacrificial material could be a photoresist that will decompose in oxygen (or more generally air or some other oxygen-containing atmosphere, or including an oxygen plasma or ozone). In connection therewith, a permanent layer may comprise, for example, a silica-based xerogel with a 10–90% porosity enabling passage of the oxygen into contact with the photoresist. The oxygen moves through the silica-based xerogel to reach and react with the photoresist to convert it to a gas that passes out through the silica-based xerogel.

Figure 3A:
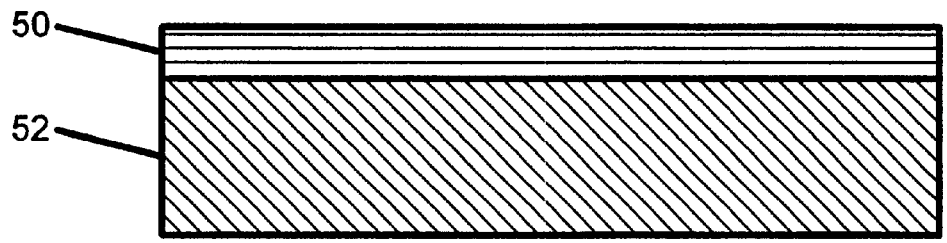
FIGS. 3A–3F are diagrammatic cross-sections of a portion of a semiconductor structure, illustrating several steps of a method according to a further aspect of the invention.
Figure 3B:
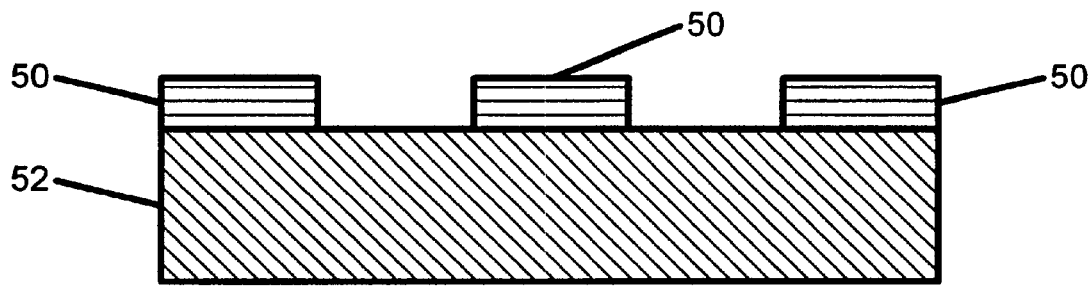

In FIGS. 3A–3F, a method of forming an air gap or region between two conductive regions or elements, such as metal lines, according to another aspect of the invention, is diagrammatically illustrated. In FIGS. 3A and 3B, a patterned layer of conductive material 50, such as aluminum, copper, gold, etc., is formed on a substrate 52. Again, the substrate may be a base layer or a layer of material overlying a base layer such as an insulating layer of $SiO_2$ that may overlie the devices on an integrated circuit chip (not shown). By way of specific example, the substrate may be a semiconductor wafer which may, for example, contain transistors, diodes, and other semiconductor elements (as are well known in the art.

As depicted in FIG. 3A, a uniform layer of the conductive material 50 is deposited on the substrate. This may be done in any suitable manner, for example, by metal sputtering, chemical vapor deposition (CVD), plating (particularly electroless plating) or other methods. In FIG. 3B, the layer of conductive material 50 is patterned to produce a pattern of the conductive material corresponding to the desired pattern of one or more electrical conductors, e.g. metal lines, leads, regions, etc., to be formed in the semiconductor device. Any suitable technique can be used to pattern the layer of conductive material, including, for example, laser ablating, etching, etc.

Figure 3C:
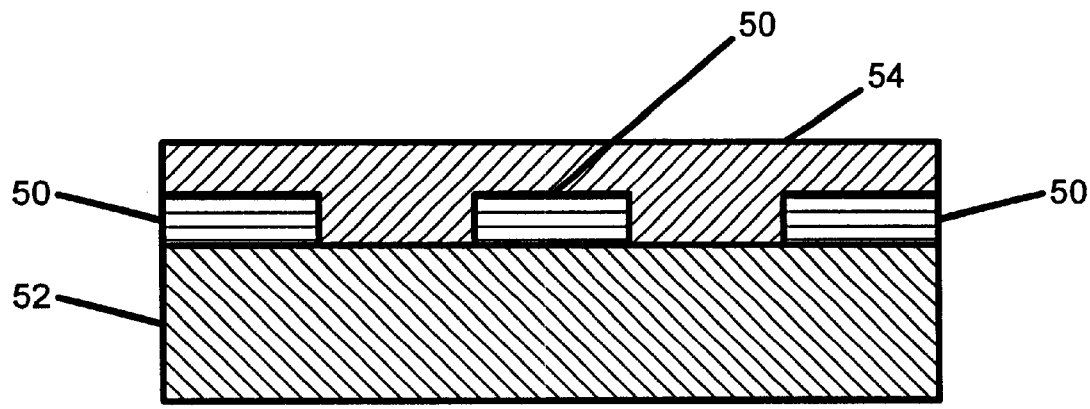

In FIG. 3C, a layer of sacrificial material 54 is deposited over the patterned layer of conductive material 50. This may be done by any suitable technique including, for example, spin coating, spraying, meniscus, extrusion or other coating methods, by pressing or laying a dry film laminate onto the substrate, etc.

Figure 3D:
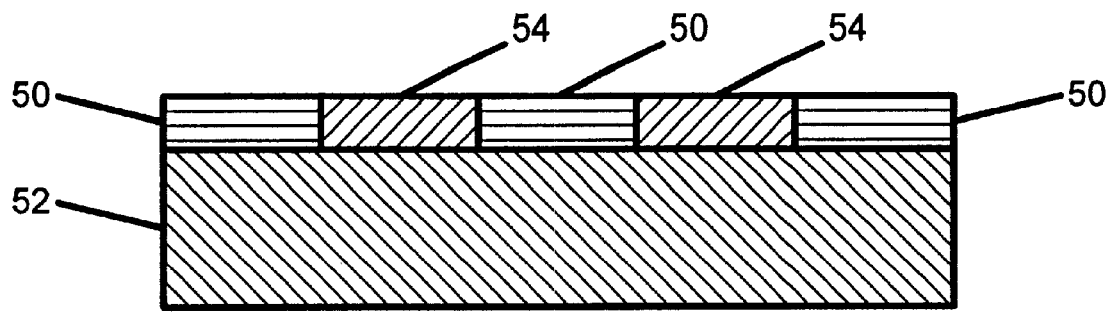

In FIG. 3D, any excess sacrificial material overlying the tops of the conductors 50 is removed and the sacrificial layer is planarized, as needed, by any suitable technique including, for example, CMP, reactive ion etching, etc.

Figure 3E:
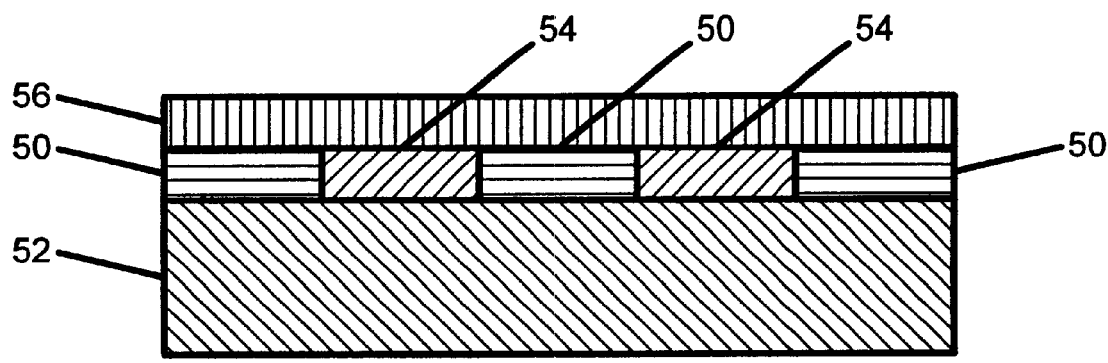

In FIG. 3E, a permanent dielectric 56 is deposited over the patterned conductive layer with the sacrificial material inlay. The permanent dielectric is deposited as a solid layer and covers the sacrificial layer and at least the tops of the metal leads of the conductive layer.

Figure 3F:
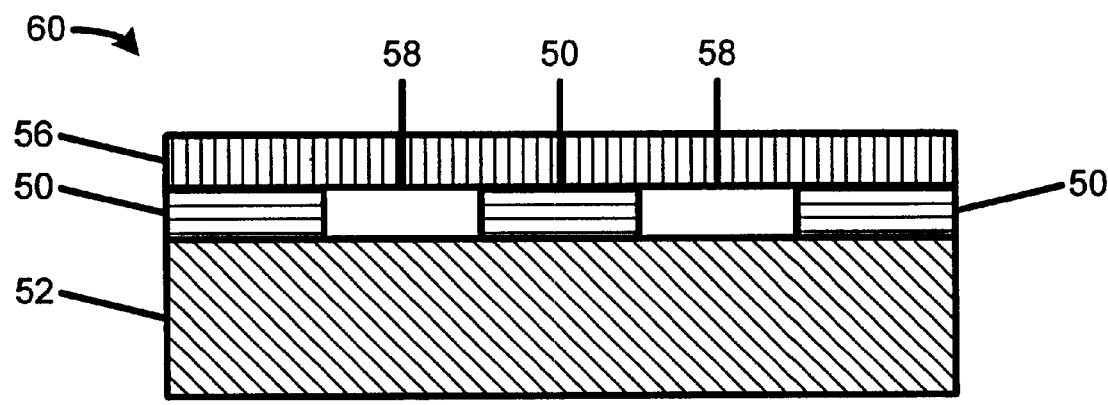

Then, like in the manner described above in respect of the method illustrated in FIGS. 2A–2F, the sacrificial material is removed through the permanent dielectric layer to form the air gaps 58 as shown in FIG. 3F. Again, in one embodiment, the removal of the sacrificial material is accomplished by thermal decomposition and passage of one or more of the decomposition products through the permanent dielectric layer 56 by diffusion. As above indicated, the sacrificial materials of the present invention will undergo thermal decomposition at temperatures on the order of about 400° C., and lower, with essentially no residue being left in the air gaps in the resultant semiconductor structure 60. Also, the decomposition products are diffusable through many dielectric materials useful in forming the permanent dielectric layer, including polyimides. Also, as above indicated, other techniques may also be employed to remove the sacrificial material, such as the other techniques described above.

Figure 4A:
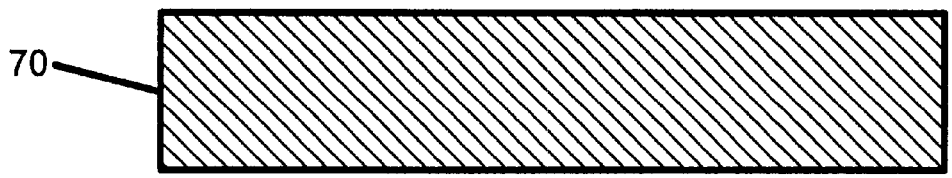
FIGS. 4A–4H are diagrammatic cross-sections of a portion of a semiconductor structure, illustrating several steps of a specific example of a method according to a the invention.
Figure 4B:
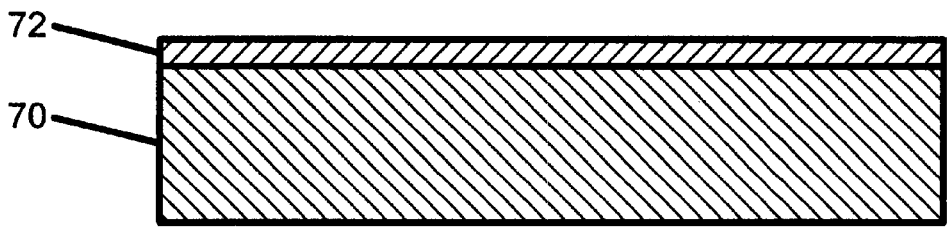
Figure 4C:
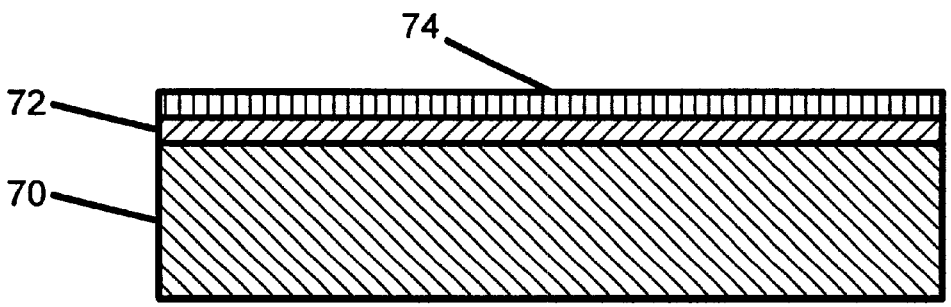
Figure 4D:
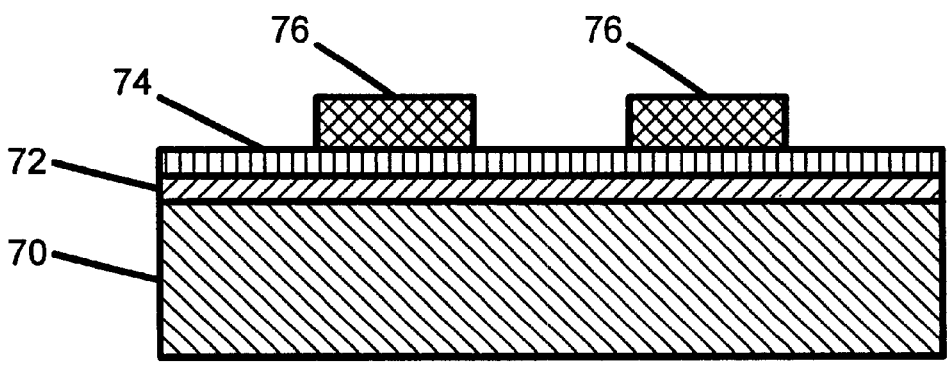
Figure 4E:
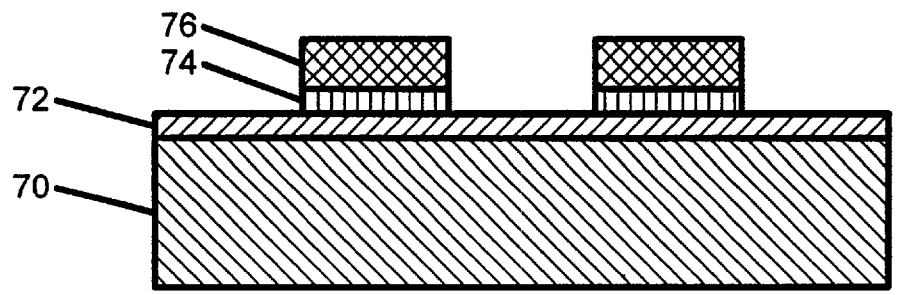
Figure 4F:
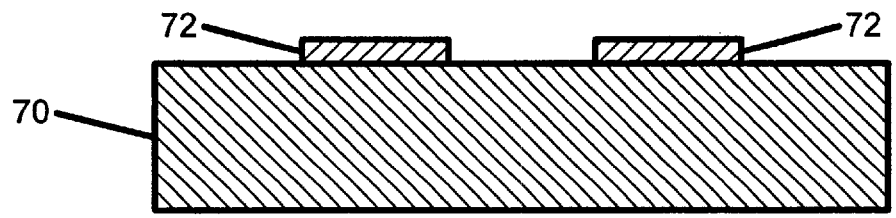
Figure 4G:
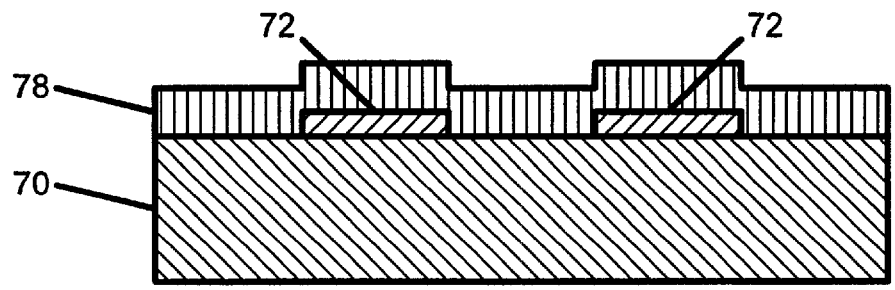
Figure 4H:
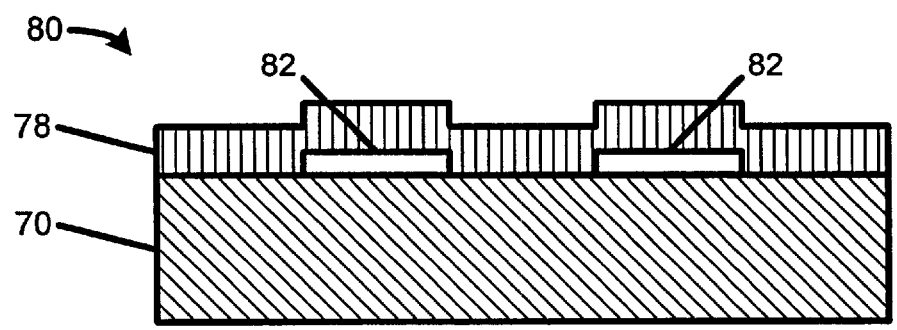

Referring now to FIGS. 4A–4H, there is illustrated a specific example of a method of forming air gaps (tunnels) in an oxide using at least one of the sacrificial materials discussed in detail above. This exemplary specific method involved the steps of:

1. In FIG. 4A, a clean, polished silicon wafer 70 is used (although as above indicated many other substrates could be used including ceramic or metal materials).
2. In FIG. 4B, a sacrificial material 72 (in this instance Avatrel® polynorbornene polymer) is spin coated onto the wafer. Spin coating involves rotating the wafer, for example at 1000 to 4000 rotations per minute, and dispensing a solution of the sacrificial material and an appropriate solvent in which the sacrificial material is dissolved. The solvent may be mesitylene, although other suitable solvents may be used such as decalin or other hydrocarbon solvents. When pendant polar substituents are present on the sacrificial polymer, propylene glycol monomethyl ether acetate (PGMEA) can be employed as a suitable solvent. The spin coating produces a uniform, thin film on the wafer having a thickness of about 0.2 to about 6 micrometers, with a uniformity less than about ±5% across the sample. However, thicker or thinner films could be applied as desired for a given application. After the coating is applied, the wafer is baked in an oven in air at about 100° C. to remove the solvent. The polynorbornene polymer is then baked at about 200 to about 300° C. in nitrogen for one hour to remove the solvent.
3. In FIG. 4C, a layer of plasma enhanced chemical vapor deposited (PECVD) silicon dioxide 74 is deposited on the surface of the polynorbornene polymer 72 using standard conditions. Suitable gases are silane and nitrous oxide.
4. In FIG. 4D, a photoresist 76 is deposited onto the wafer by spin coating, soft baked, exposed, developed and then hard baked under standard conditions following manufacturer's specifications.
5. In FIG. 4E, the sample is reactive ion etched. The pattern in the photoresist 76 is transferred to the silicon dioxide 74 by first using a fluorine containing plasma. The polynorbornene polymer 72 is then etched by using an oxygen/fluorine plasma. During the process, the photoresist is also etched. After the polynorbornene polymer is etched in the exposed areas, a fluorine plasma is used to strip the silicon dioxide mask. The sample now has only patterned polynorbornene polymer 72 as shown in FIG. 4F.
6. In FIG. 4G, silicon dioxide 78 (although other permanent dielectric materials could be used) is deposited onto the patterned polynorbornene polymer 72. The process is similar to that used in Step 3 above to deposit the silicon dioxide on the surface of the polynorbornene polymer. The polynorbornene polymer is now totally encapsulated in a permanent dielectric material 78.
7. In FIG. 4H, the sample is heated to a temperatures greater than the decomposition temperature of the polynorbornene polymer 72. The sacrificial material decomposes and one or more of the gaseous decomposition products diffuse out through the overcoat material 78.
8. The result is an oxide composite 80 including air gaps 82 completely surrounded by dielectric material 78.

Figure 5A:
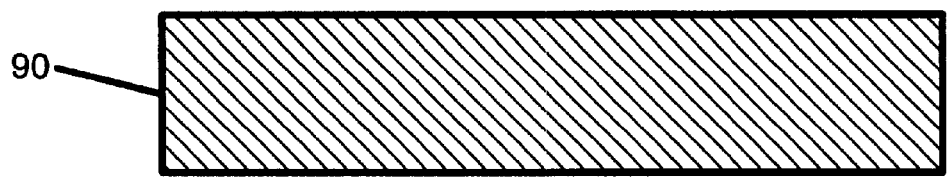
FIGS. 5A–5J are diagrammatic cross-sections of a portion of a semiconductor structure, illustrating several steps of another specific example of a method according to the invention.
Figure 5B:
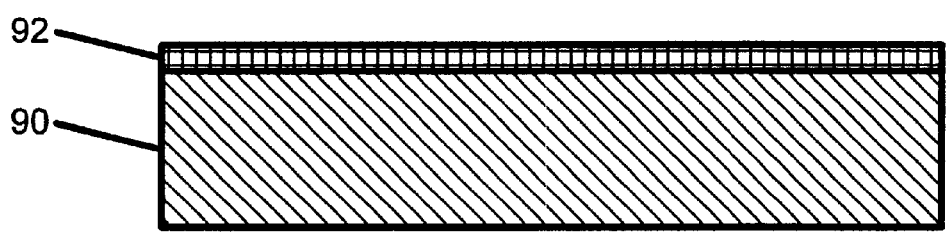
Figure 5C:
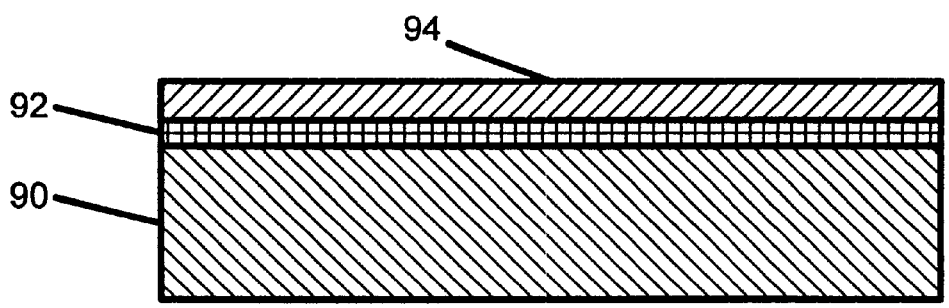
Figure 5D:
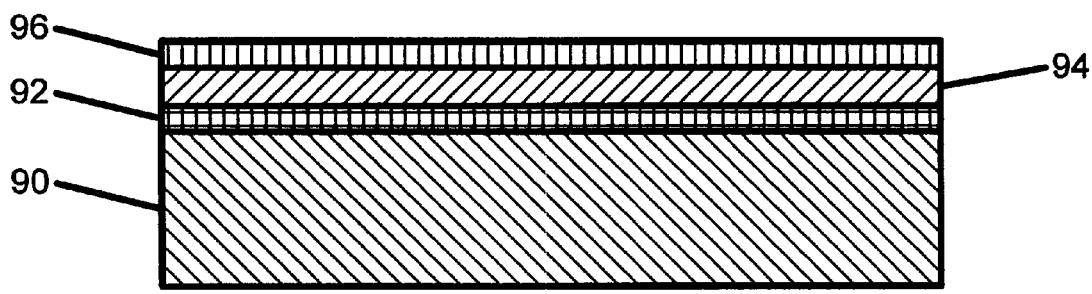
Figure 5E:
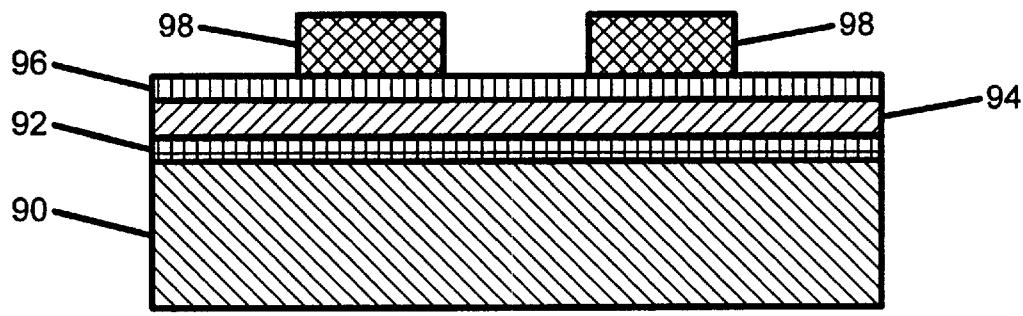
Figure 5F:
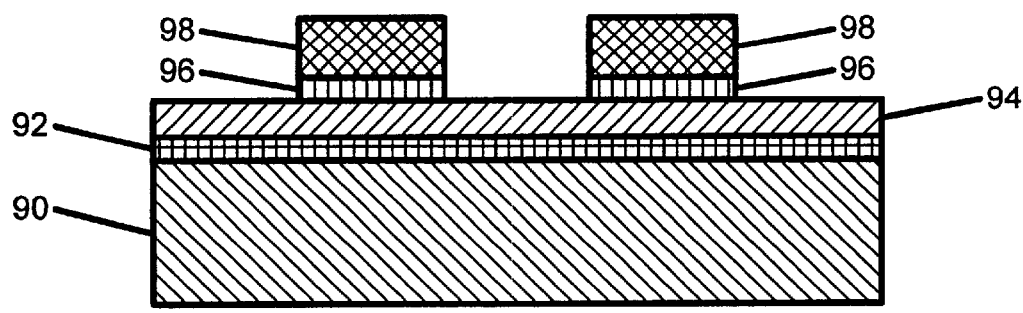
Figure 5G:
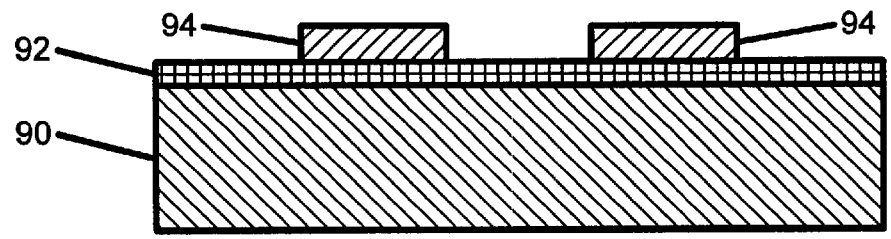
Figure 5H:
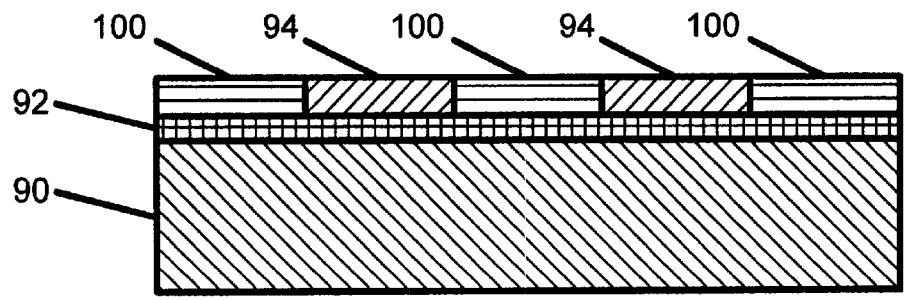
Figure 5I:
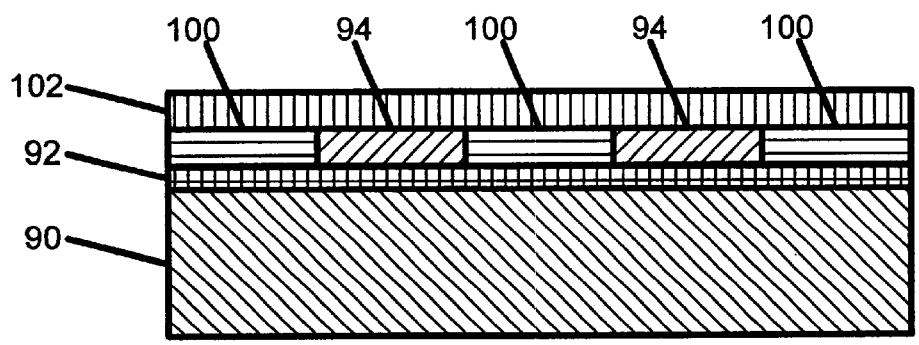
Figure 5J:
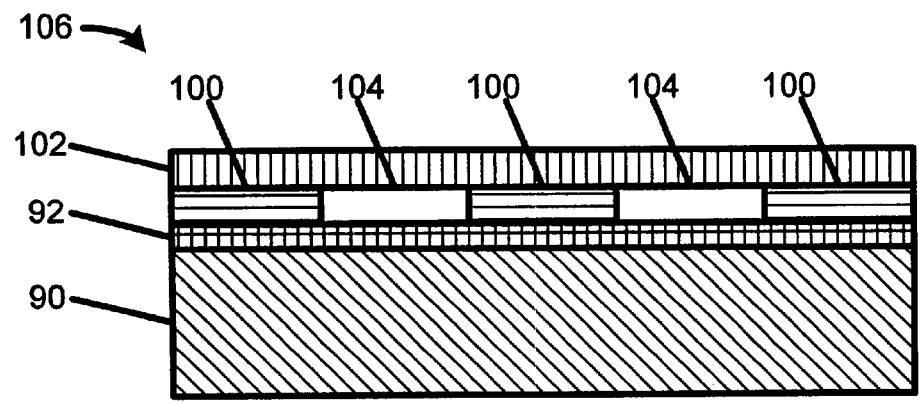

Referring now to FIGS. 5A–5H, there is illustrated a specific example of a method of forming air gaps between metal lines of an electrical interconnect device or layer using, for example, a polynorbornene polymer. This exemplary specific method involved the steps of:

1. In FIG. 5A, a clean, polished silicon wafer 90 is used.
2. In FIG. 5B, a 1000 Å chromium layer followed by 2000 Å of gold is sputtered onto the wafer 90 to form a composite chromium/gold layer 92. The sputtering may use direct current (DC) sputtering.
3–7. In FIGS. 5C–5F, a layer of a sacrificial material 94 (in this instance the sacrificial material is a polynorbornene polymer) is applied and patterned using silicon dioxide 96 and photoresist 98 as described above in Steps 3–7 of the method illustrated in FIGS. 4A–H.
8. In FIG. 5G, the sample is similar to the sample at Step 6 of the method illustrated in FIGS. 4A–H, except that a Cr/Au layer 92 lies under the polynorbornene polymer 94.
9. In FIG. 5H, gold is plated until its height is the same as the height of the polynorbornene polymer 94. The Cr/Au layer 92 serves as an electrical contact and base for the plating of gold between the regions of polynorbornene polymer 94. The electroplating may be done in a conventional, pH+7.2 potassium gold cyanide bath using a phosphate buffer.
10. In FIG. 5I, the gold layer 100 and sacrificial layer 94 are coated with PECVD silicon dioxide 102, just as in Step 7 of the method illustrated in FIGS. 4A–H.
11. In FIG. 5J, the sample is heated to decompose the polynorbornene polymer 94 and form one or more air gaps 104 between adjacent metal lines 100 in the resultant semiconductor structure 106.

Figure 6A:
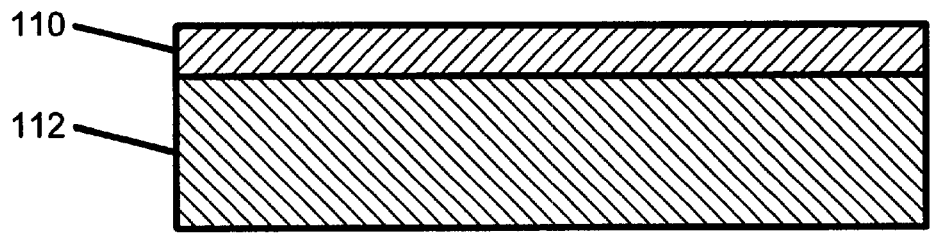
FIGS. 6A–6I are diagrammatic cross-sections of a portion of a semiconductor structure, illustrating several steps of a method according to another aspect of the invention.
Figure 6B:
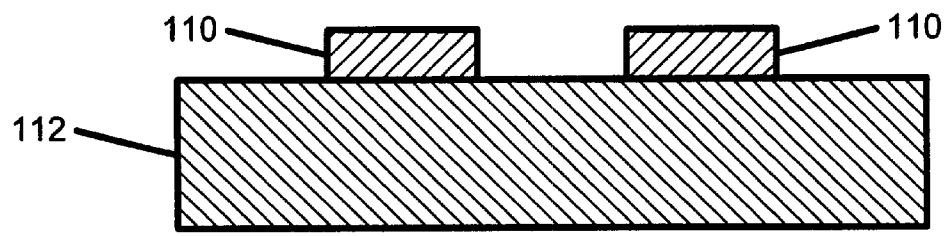
Figure 6C:
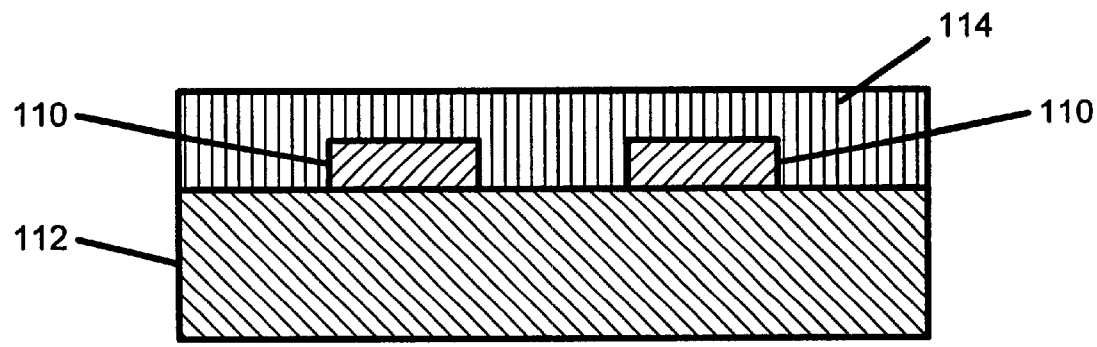
Figure 6D:
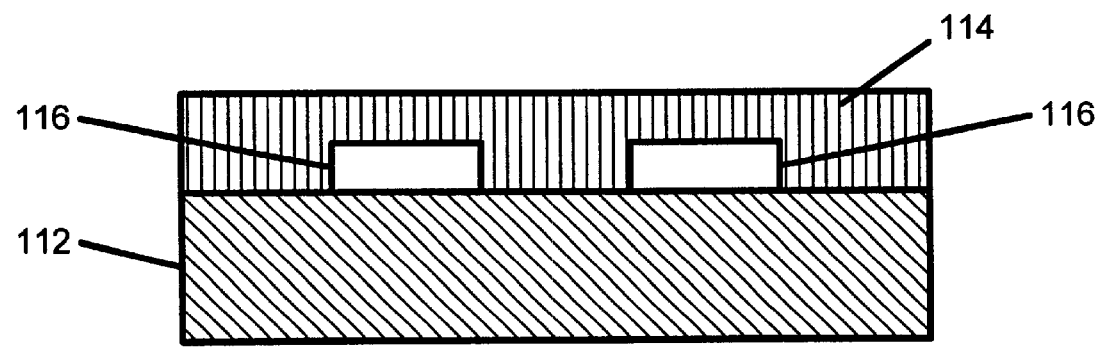

Referring now to FIGS. 6A–6I, there is illustrated a specific example of a method of forming multi-layer air gaps in a layer of a solid non-sacrificial material. This exemplary specific method involved the steps of:

1. In FIGS. 6A and 6B, a patterned layer of sacrificial material 110 is formed on a substrate 112 by any suitable technique. This may be accomplished, for example, by first forming a layer of the sacrificial material on the substrate 112 as depicted in FIG. 6A and then patterning the layer, for example by etching or any other suitable technique, to form the patterned layer of sacrificial material 110 having one or more "hills" formed by the sacrificial material on the substrate with "valleys" formed between any two relatively adjacent hills.
2. In FIG. 6C, a second solid layer of a non-sacrificial material 114 is then formed on the patterned layer in overlying relation to the patterned layer 110.
3. In FIG. 6D, the sample is heated to a temperature sufficient to decompose the sacrificial material 110 thereby forming air gaps 116. The sacrificial material decomposes and one or more of the gaseous decomposition products diffuse out through the second solid layer of a non-sacrificial material 114.

Figure 6E:
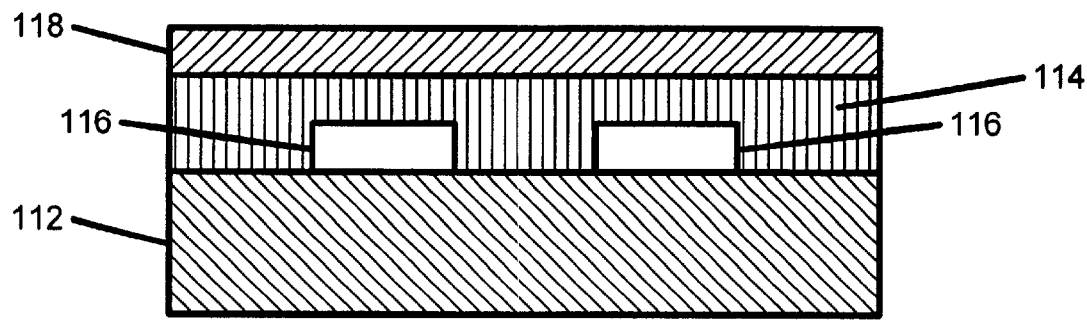
Figure 6F:
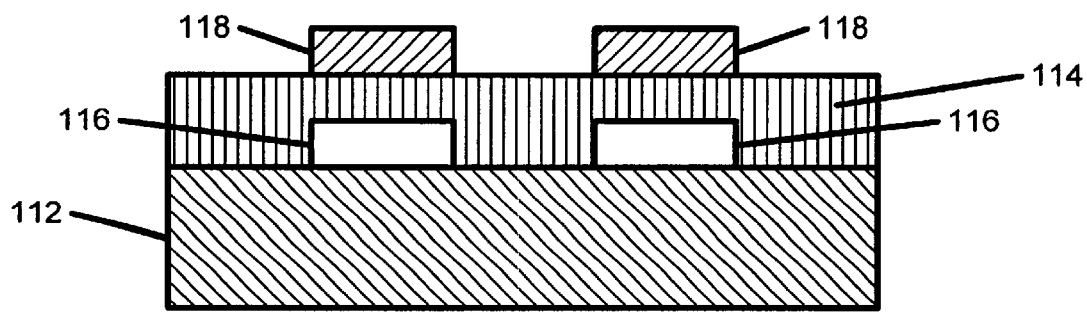

4. In FIGS. 6E and 6F a second patterned layer of sacrificial material 118 is formed on the second solid layer of a non-sacrificial material 114 by any suitable technique. This may be accomplished, for example, by first forming the second layer of the sacrificial material 118 on the second solid layer of a non-sacrificial material 114 as depicted in FIG. 6F and then patterning the second layer, for example by etching or any other suitable technique, to form the second patterned layer of sacrificial material 118 having one or more "hills" formed by the sacrificial material on the substrate with "valleys" formed between any two relatively adjacent hills.

Figure 6G:
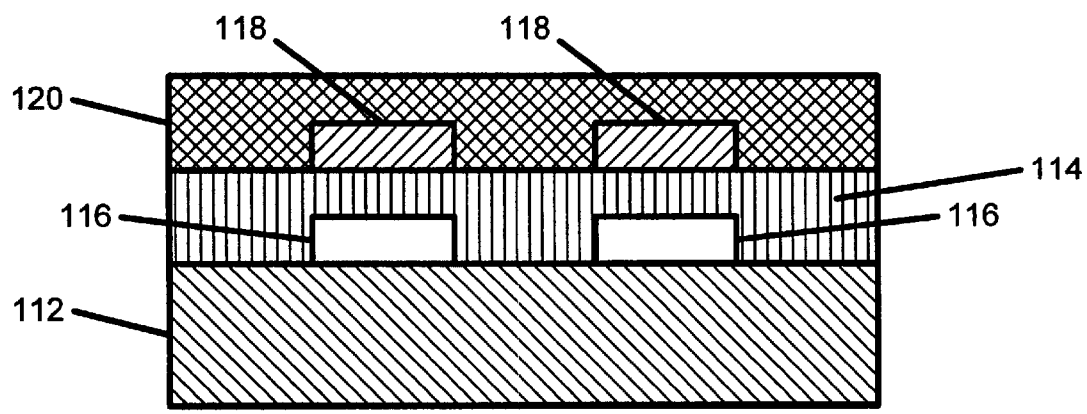

5. In FIG. 6G, a third solid layer of a non-sacrificial material 120 is then formed on the second patterned layer in overlying relation to the second patterned layer 118 (the composition of this layer can be identical to or different from layer 114).

Figure 6H:
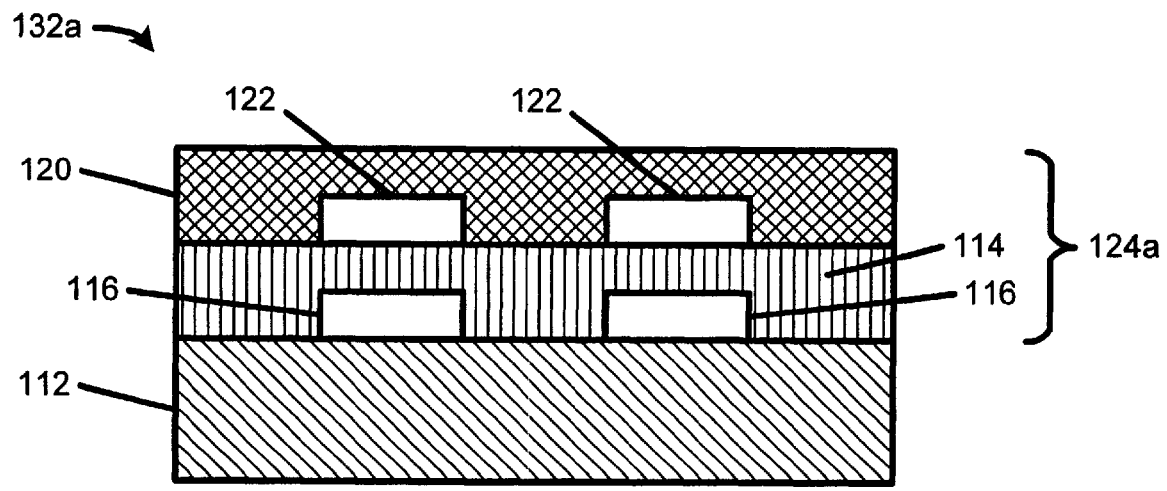
Figure 6I:
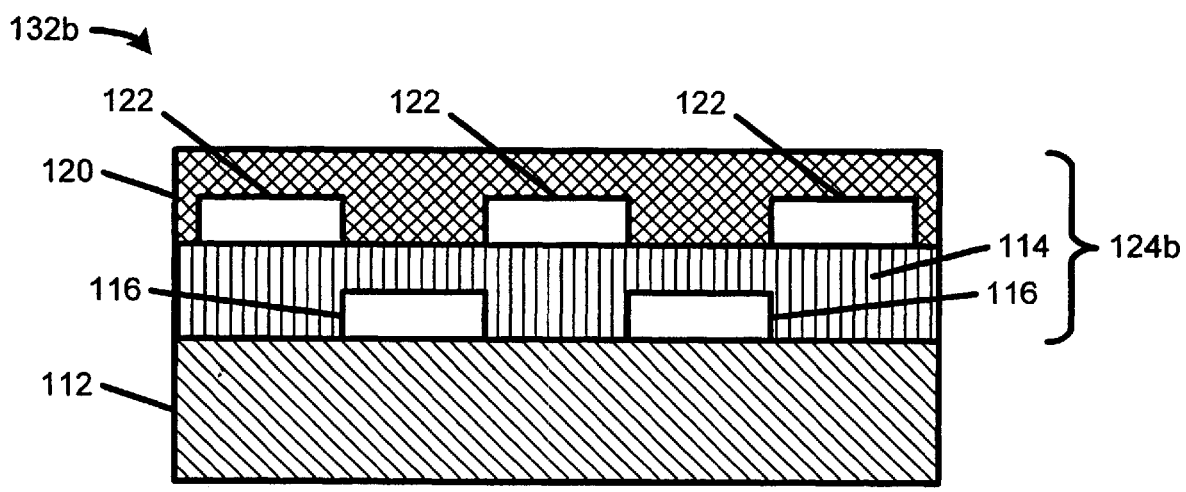

6. In FIG. 6H, the sample is heated to a temperature sufficient to decompose the sacrificial material 118 thereby forming air gaps 122. The sacrificial material decomposes and one or more of the gaseous decomposition products diffuse out through the second solid layer of a non-sacrificial material 120.

7. The result is an air-gap structure 124a having two or more levels of air gaps 116 and 122 in the closed interior space or spaces previously occupied by the sacrificial materials 110 and 118. In one embodiment, as shown in device 132a, the air gaps 122 can be aligned so as to directly over top of air gaps 116. Alternatively, other arrangements of the multi levels of air gaps are contemplated by the present invention. For example, as is illustrated in device 132b of FIG. 6I the air gaps 122 can be formed so as to form a multi level "staggered" arrangement with air gaps 116 thereby yielding air gap structure 124b.

Additionally, it should be noted that a boundary may or may not exist between layers 114 and 120 depending upon the composition of these layers and the manner in which layer 120 is formed. Also, the sacrificial material used to form the first level of air gaps and that used to form the second (or any subsequent level of air gaps) can be the same material or a different material.

Figure 7A:
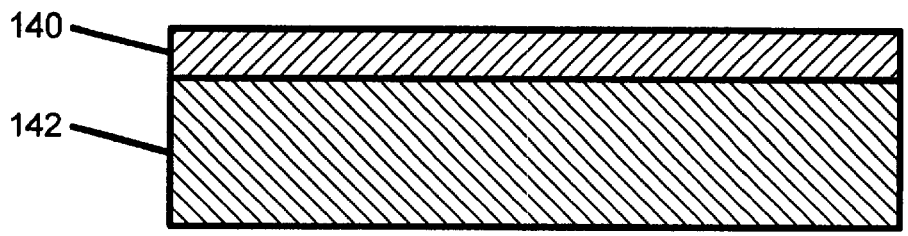
FIGS. 7A–7H are diagrammatic cross-sections of a portion of a semiconductor structure, illustrating several steps of a method according to another aspect of the invention.
Figure 7B:
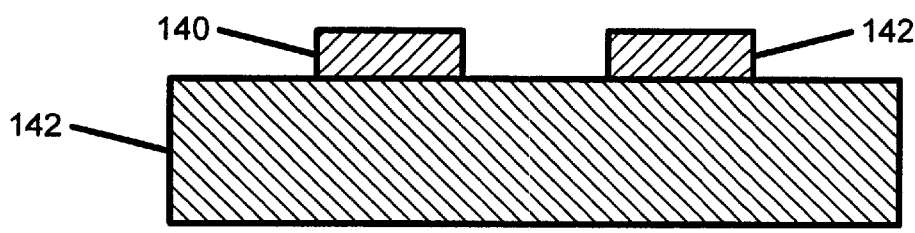

Referring now to FIGS. 7A–7H, there is illustrated a specific example of a method of simultaneously forming multi-layer air gaps in a layer of a solid non-sacrificial material. This exemplary specific method involved the steps of:

1. In FIGS. 7A and 7B, a patterned layer of sacrificial material 140 is formed on a substrate 142 by any suitable technique. This may be accomplished, for example, by first forming a layer of the sacrificial material on the substrate 142 as depicted in FIG. 7A and then patterning the layer, for example by etching or any other suitable technique, to form the patterned layer of sacrificial material 140 having one or more "hills" formed by the sacrificial material on the substrate with "valleys" formed between any two relatively adjacent hills.

Figure 7C:
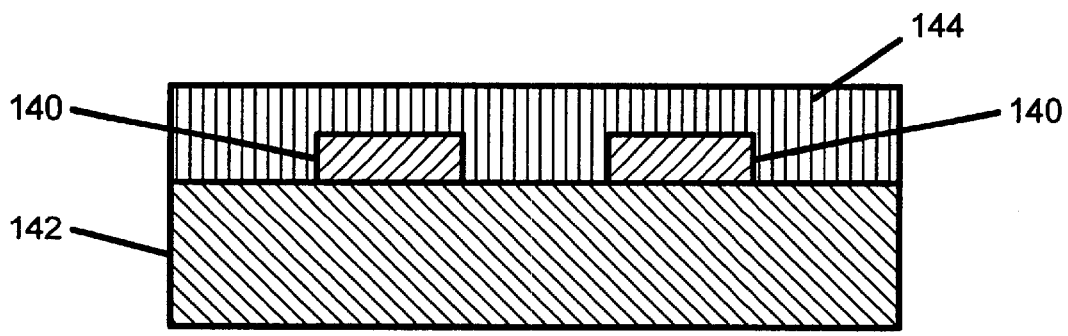

2. In FIG. 7C, a second solid layer of a non-sacrificial material 144 is then formed on the patterned layer in overlying relation to the patterned layer 140.

Figure 7D:
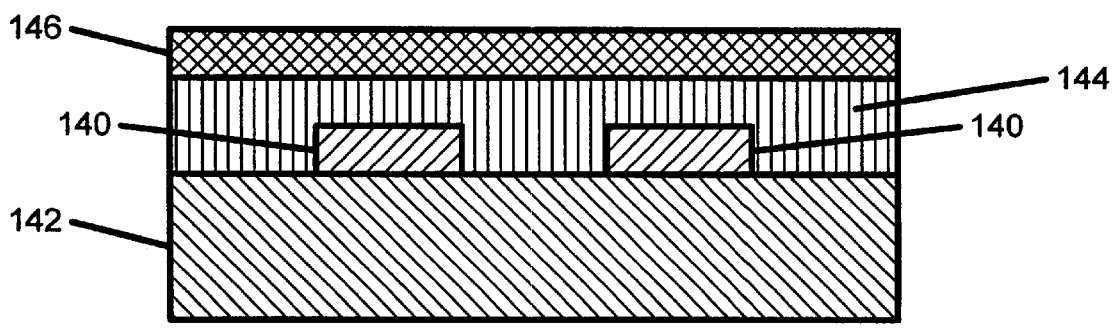
Figure 7E:
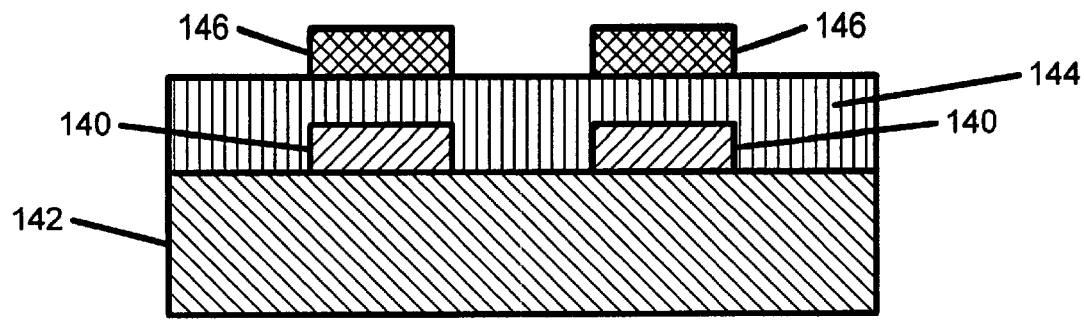

3. In FIGS. 7D and 7E, a second patterned layer of sacrificial material 146 is formed on the second solid layer of a non-sacrificial material 144 by any suitable technique. This may be accomplished, for example, by first forming a second layer of the sacrificial material on the second solid layer of a non-sacrificial material 144 as depicted in FIG. 7D and then patterning the second layer, for example by etching or any other suitable technique, to form the second patterned layer of sacrificial material 146 having one or more "hills" formed by the sacrificial material on the second solid layer of a non-sacrificial material 144 with "valleys" formed between any two relatively adjacent hills.

Figure 7F:
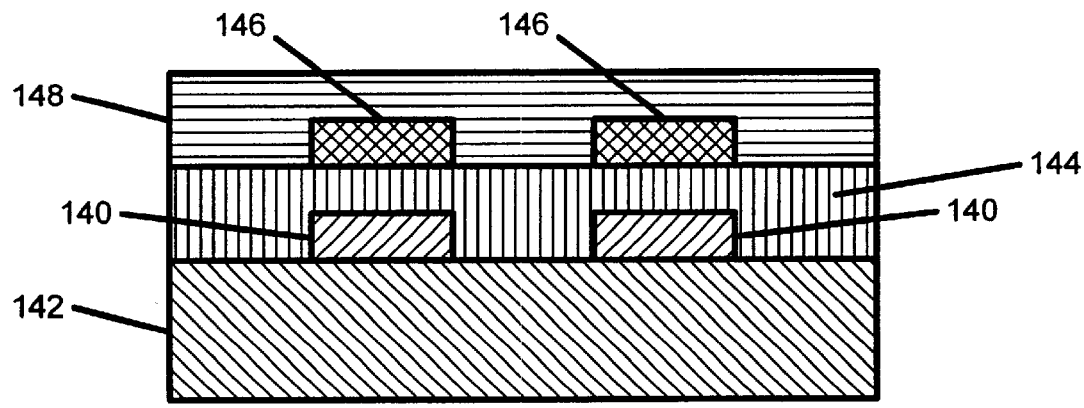

4. In FIG. 7F, a third solid layer of a non-sacrificial material 148 is then formed on the second patterned layer in overlying relation to the second patterned layer 146. The composition of this layer can be identical to or different from layer 144, and, as noted above, a boundary between layers 144 and 148 may or may not exist.

Figure 7G:
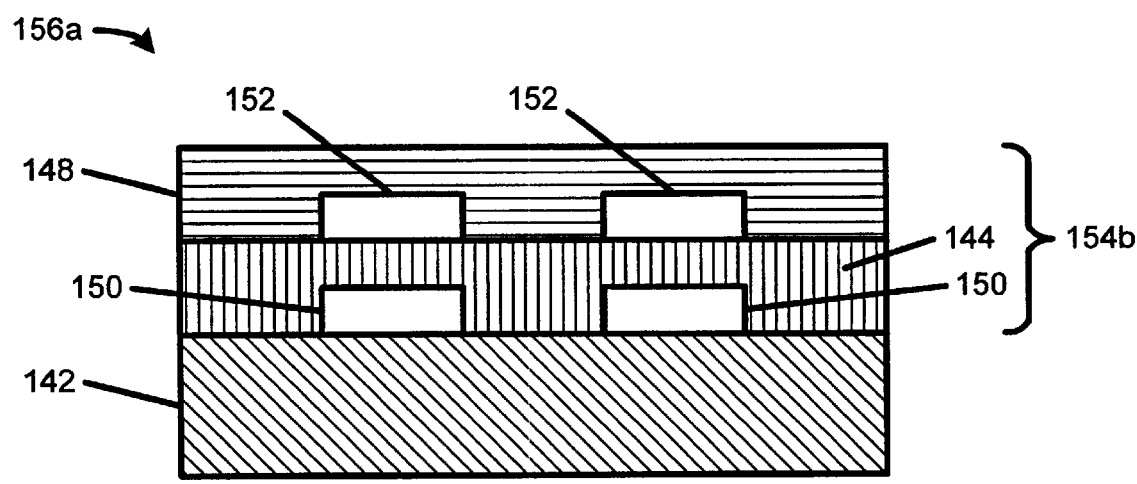
Figure 7H:
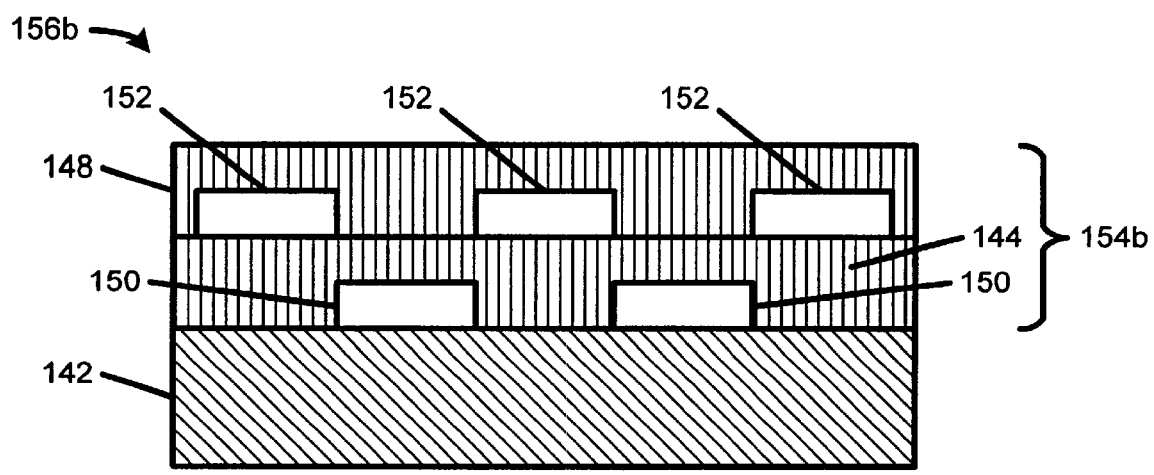

5. In FIG. 7G, the sample is heated to a temperature sufficient to decompose both sacrificial material 140 and 146 thereby forming air gaps 150 and 152, respectively. Both sacrificial materials decompose and one or more of the gaseous decomposition products diffuse out through the second and third solid layers of a non-sacrificial material 144 and 148, respectively, for sacrificial material 140, and through the third solid layer of a non-sacrificial material 148 for sacrificial material 146.

6. The result is an air-gap structure 154a having two or more levels of air gaps 150 and 152 in the closed interior space or spaces previously occupied by the sacrificial materials 140 and 146. In one embodiment, as shown in device 156a, the air gaps 152 can be aligned so as to directly over top of air gaps 150. Alternatively, other arrangements of the multi levels of air gaps are contemplated by the present invention. For example, as is illustrated in device 156b of FIG. 7H the air gaps 152 can be formed so as to form a multi level "staggered" arrangement with air gaps 150 thereby yielding air gap structure 154b.

It should be noted that with regard to the method of FIGS. 6A–6I and that of FIGS. 7A–7H, the main difference is that in the method of FIGS. 6A–6I the multi levels of air gaps are formed sequentially and in FIGS. 7A–7H they are formed simultaneously. Numerous considerations play a role in determining which method is most suitable. For example, the composition of the non-sacrificial and sacrificial layers, the structure desired, the mechanical strength of the first level (in the process of FIGS. 6A–6I the first level has to be of sufficient strength to withstand the processing of the second level), and the ability of the sacrificial material to diffuse through not only one but two or more layers of non-sacrificial material (see the method of FIGS. 7A–7H).

Figure 8A:
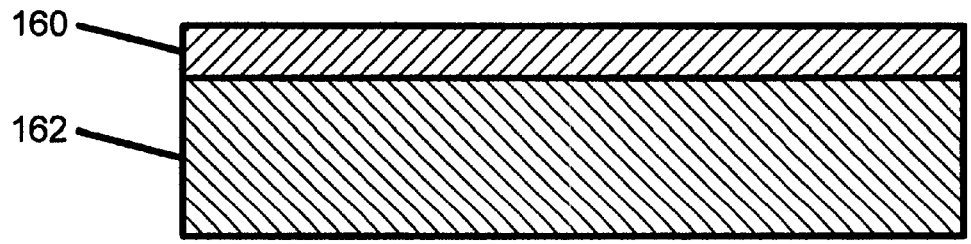
FIGS. 8A–8G are diagrammatic cross-sections of a portion of a semiconductor structure, illustrating several steps of a method according to another aspect of the invention.
Figure 8B:
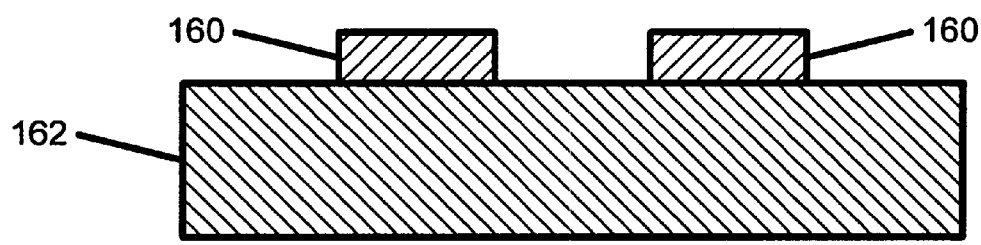

FIGS. 8A–8G illustrate one possible method of forming an air gap or region between two conductive regions or elements, such as metal lines, in which the conductive regions are over-coated and thus isolated from direct contact with the air gap structures according to the present invention. In FIGS. 8A and 8B, a patterned layer of sacrificial material 160 is formed on a substrate 162. The substrate 162 may have patterns already on it, or it may be an unpatterned material. The substrate may be a base layer or a layer of material overlying a base layer such as an insulating layer of $SiO_2$ that may overlie the devices on an integrated circuit chip (not shown). By way of specific example, the substrate may be a semiconductor wafer which may, for example, contain transistors, diodes, and other semiconductor elements (as are well known in the art).

1. In FIG. 8A, a uniform layer of the sacrificial material 160 is deposited on the substrate 162. This may be done in any suitable manner, for example, by spin coating, spraying, meniscus, extrusion or other coating methods, by pressing or laying a dry film laminate onto the substrate, etc.

2. In FIG. 8B, the layer of sacrificial material is patterned to produce the patterned layer of the sacrificial material 160, the pattern of which corresponds to the desired pattern of one or more air gaps to be formed in the semiconductor device. Any suitable technique can be used to pattern the layer of sacrificial material, including, for example, laser ablating, etching, etc. The sacrificial material may be of a type that is or may be made photosensitive to facilitate patterning.

Figure 8C:
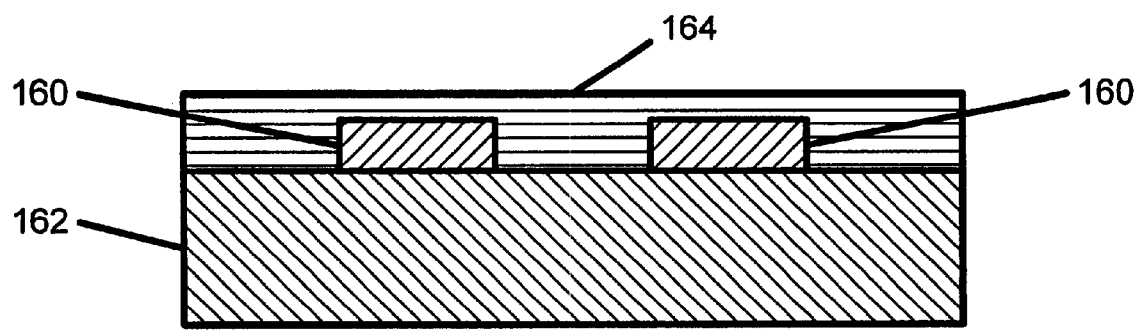

3. In FIG. 8C, a layer of conductive material 164, (in one embodiment, the conductive material is any suitable metal or alloy or composite thereof) is deposited over the patterned layer of sacrificial material 160. This may be done by any suitable technique including, for example, metal sputtering, chemical vapor deposition (CVD), physical vapor deposition (PVD), electroplating, electroless plating, etc.

Figure 8D:
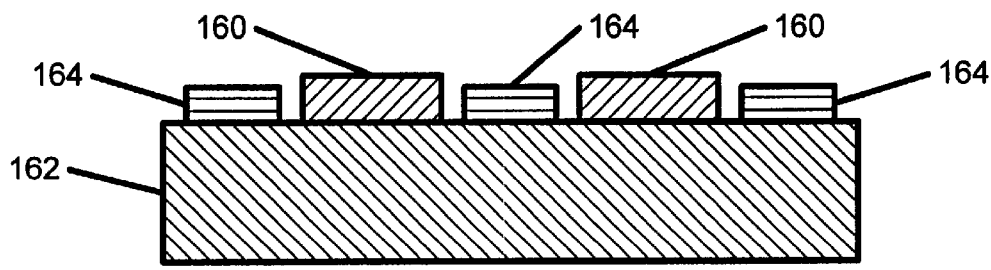

4. In FIG. 8D, the conductive layer 164 is removed as needed by any suitable technique including, for example, a wet chemical etch utilizing a suitable etching compound (e.g., nitric acid). If a wet chemical etch is used a layer of silicon dioxide can be applied to the surface of the sacrificial layer to provide an etch stop. As can be seen from FIG. 8D layer 164 is removed not only on its surface but also on the sides thereof which are either in contact with the patterned sacrificial polymer layer 160 or at the edges of the device.

Figure 8E:
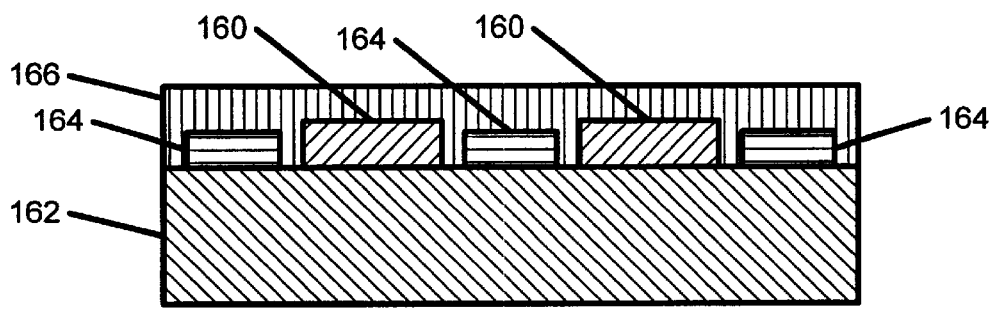

5. In FIG. 8E, a permanent dielectric 166 having excellent gap-fill capabilities (e.g., a polyimide) is deposited over the patterned layer of sacrificial material 160 with the conductive inlay 164. The permanent dielectric 166 is deposited as a solid layer and covers the sacrificial layer 160 and overcoats at least the tops and sides of the conductive leads 164. The permanent dielectric layer may be planarized before or after removal of the sacrificial material. The permanent dielectric layer, for example, may be silicon dioxide, polyimide or other material. The permanent dielectric layer may be deposited by spin coating, spray coating or meniscus coating (typically using the sacrificial material dissolved in a solvent), chemical vapor deposition, plasma enhanced chemical vapor deposition, sol-gel process, or other method. As seen in FIG. 8E, the conductive layer can be conveniently formed with a height less than the height of the adjacent sacrificial material. As will be appreciated, this will result in air gaps that extend above the tops of the conductive leads, as is desirable to reduce capacitive coupling. Also, the substrate could have trenches formed therein in a pattern corresponding to the pattern of the sacrificial material, so that the resultant air gaps will extend below the conductive leads located on lands on the substrate between the trenches.

Figure 8F:
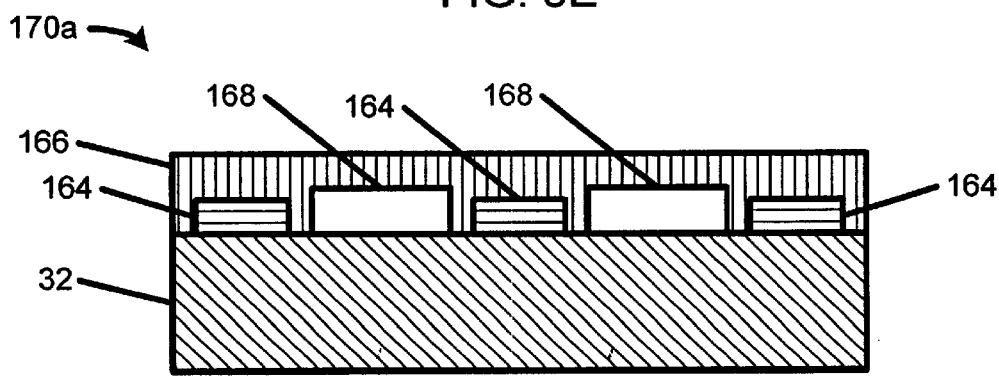

6. In FIG. 8F, the sacrificial material 160 is removed through the permanent dielectric layer 166 to form the air gaps 168. The removal of the sacrificial material is, in one embodiment, accomplished by thermal decomposition and passage of one or more of the decomposition products through the permanent dielectric layer 166 by diffusion. As above indicated, the sacrificial materials of the present invention will undergo thermal decomposition at temperatures on the order of about 450° C., and lower, with essentially no residue being left in the air gaps of the resultant semiconductor structure 170a. Also, the decomposition products are diffusable through many dielectric materials useful forming the permanent dielectric layer, including polyimides.

Figure 8G:
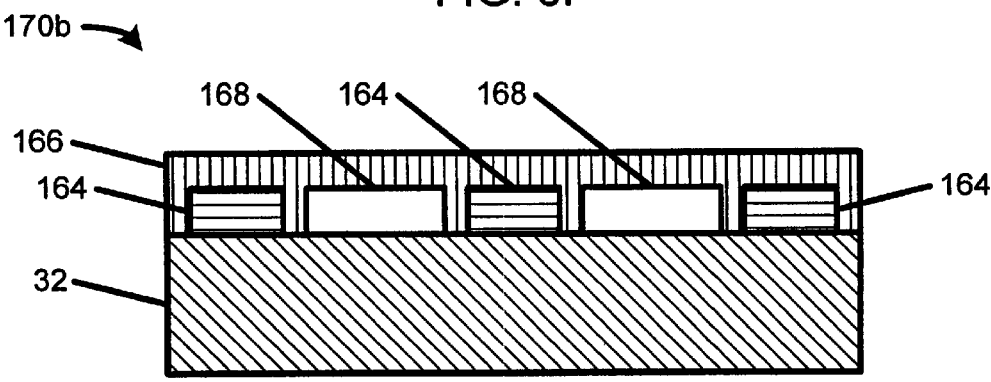

Referring specifically to FIG. 8G, FIG. 8G discloses another embodiment according to steps 1–6 discussed immediately above with the exception that the conductive layer 164 is planarized in step 4 as needed by any suitable technique including, for example, a wet chemical etch utilizing a suitable etching compound (e.g., nitric acid). Additionally, as can be seen from FIG. 8G, the planarization process in this embodiment is conducted so as to create gaps between adjacent portions of the sacrificial material 160 and the conductive layer 164 by removing a portion of the conductive layer adjacent to sacrificial material 160. Again, if a wet chemical etch is used a layer of silicon dioxide can be applied to the surface of the sacrificial layer to provide an etch stop. After completion of step 4 the device is further processed according to steps 5 and 6 as discussed above to yield semiconductor structure 170b.

Figure 9A:
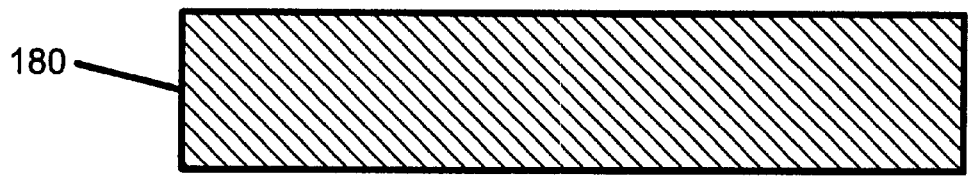
FIGS. 9A–9L are diagrammatic cross-sections of a portion of a semiconductor structure, illustrating several steps of another specific example of a method according to the invention.

Referring now to FIGS. 9A–9L, there is illustrated a specific example of a method of forming air gaps between conductive lines of an electrical interconnect device or layer using a sacrificial polymer material (in this instance a polynorbornene polymer was utilized). This exemplary specific method involved the steps of:

1. In FIG. 9A, a clean, polished silicon wafer 180 is used.

Figure 9B:
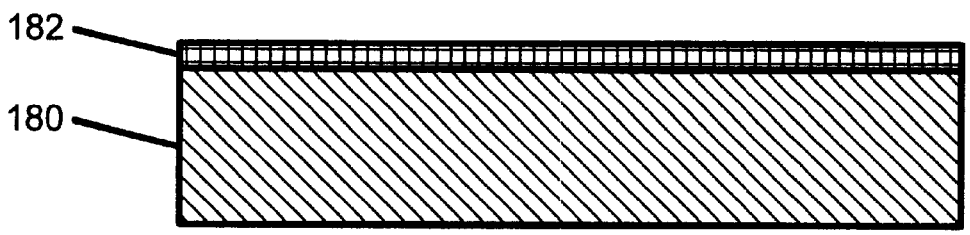
Figure 9C:
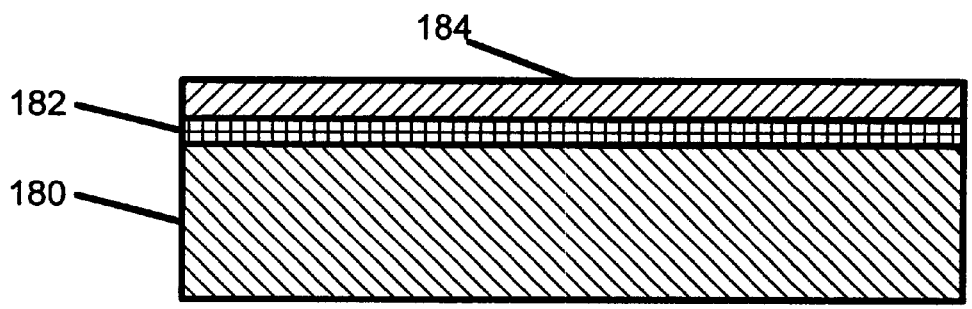
Figure 9D:
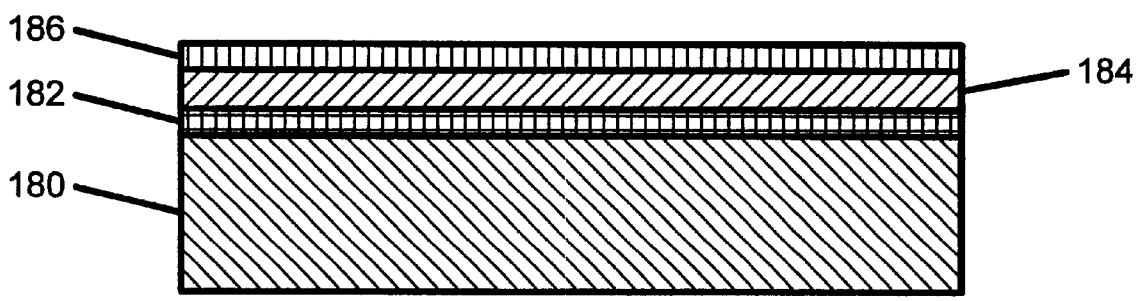
Figure 9E:
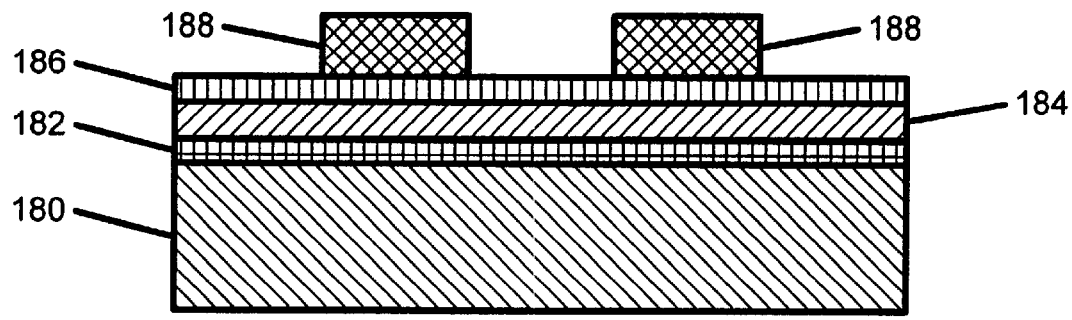
Figure 9F:
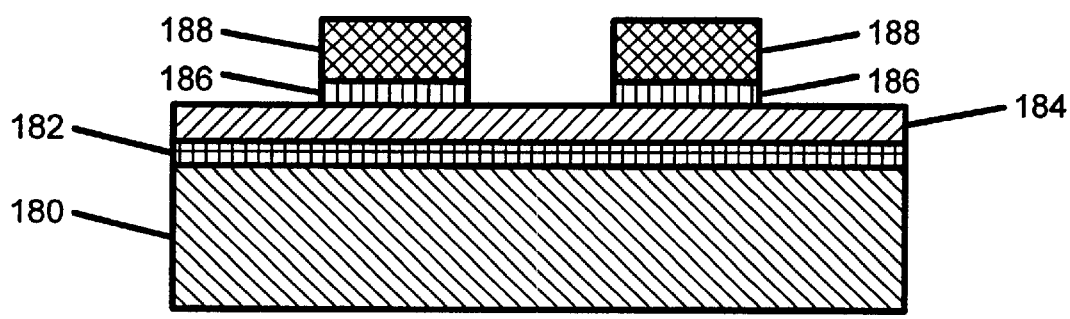

2. In FIG. 9B, a seed layer of Ti/Cu/Ti is sputtered onto the wafer 180 to form a layer 182. The sputtering may use direct current (DC) sputtering. Layer 92 may be any suitable thickness. For example, in one embodiment, layer 92 is about 10 Å to about 500,000 Å. In another embodiment, layer 92 is about 100 Å to about 250,000 Å thick. In yet another embodiment, layer 92 is about 1000 Å to about 100,00 Å thick.

3–7. In FIGS. 9C–9F, a layer of a sacrificial material 184 (in this instance the sacrificial material is a polynorbornene polymer) is applied and patterned using silicon dioxide 186 and photoresist 188 as described above in Steps 3–7 of the method illustrated in FIGS. 4A–H.

Figure 9G:
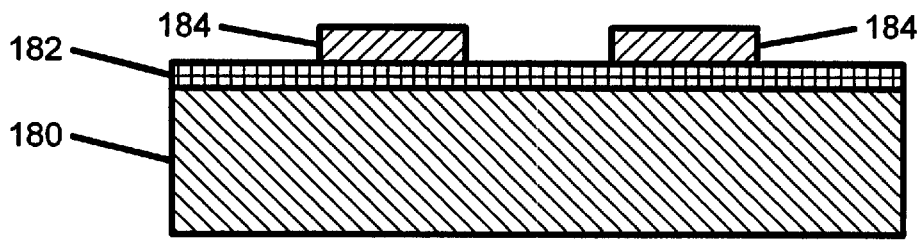

8. In FIG. 9G, the sample is similar to the sample at Step 6 of the method illustrated in FIGS. 4A–H, except that a Ti/Cu/Ti layer 182 lies under the polynorbornene polymer 184.

Figure 9H:
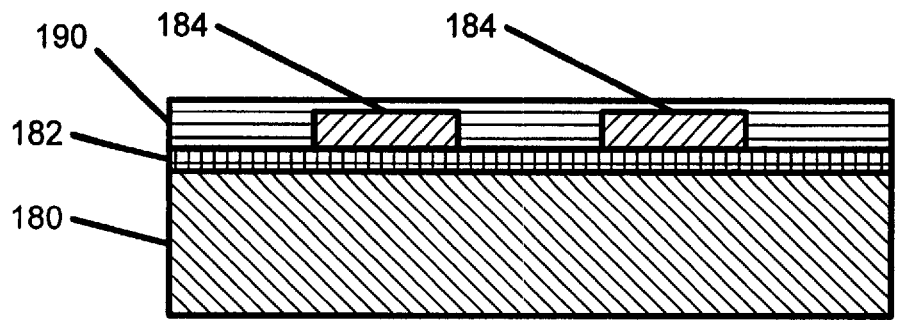

9. In FIG. 9H, a layer of conductive material 190 (e.g., a metal such as copper, aluminum or gold) is deposited over the patterned layer of sacrificial material 184. This may be done by any suitable technique including, for example, metal sputtering, chemical vapor deposition (CVD), physical vapor deposition (PVD), electroplating, electroless plating, etc.

Figure 9I:
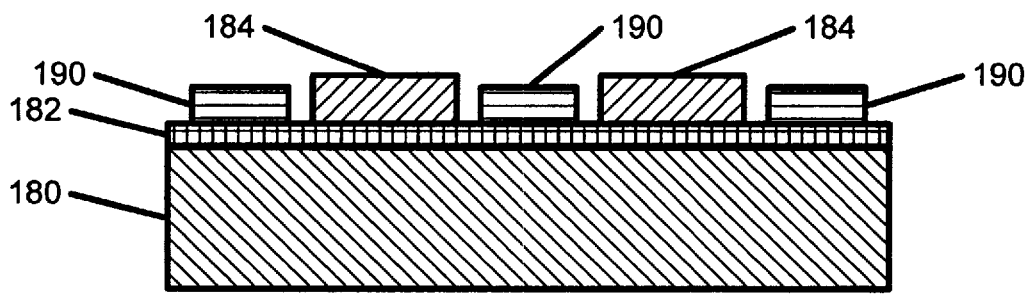

10. In FIG. 9I, the conductive layer 190 is removed as needed by any suitable technique including, for example, a wet chemical etch utilizing a suitable etching compound (e.g., nitric acid). If a wet chemical etch is used a layer of silicon dioxide can be applied to the surface of the sacrificial layer to provide an etch stop. As can be seen from FIG. 9I layer 190 is removed not only on its surface but also on the sides thereof which are either in contact with the patterned sacrificial polymer layer 184 or at the edges of the device.

Figure 9J:
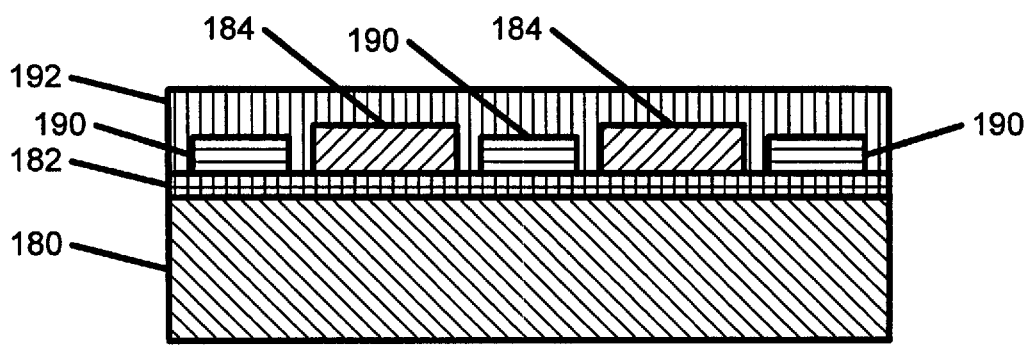

11. In FIG. 9J, a permanent dielectric 192 having excellent gap-fill capabilities (e.g., a polyimide) is deposited over the patterned layer of sacrificial material 184 with the conductive inlay 190. The permanent dielectric 1192 is deposited as a solid layer and covers the sacrificial layer 1184 and overcoats at least the tops and sides of the conductive leads 190. The permanent dielectric layer may be removed before or after removal of the sacrificial material. The permanent dielectric layer, for example, may be silicon dioxide, polyimide or other material. The permanent dielectric layer may be deposited by spin coating, spray coating or meniscus coating (typically using the sacrificial material dissolved in a solvent), chemical vapor deposition, plasma enhanced chemical vapor deposition, sol-gel process, or other method. As seen in FIG. 9J, the conductive layer can be conveniently formed with a height less than the height of the adjacent sacrificial material. As will be appreciated, this will result in air gaps that extend above the tops of the conductive leads, as is desirable to reduce capacitive coupling. Also, the substrate could have trenches formed therein in a pattern corresponding to the pattern of the sacrificial material, so that the resultant air gaps will extend below the conductive leads located on lands on the substrate between the trenches.

Figure 9K:
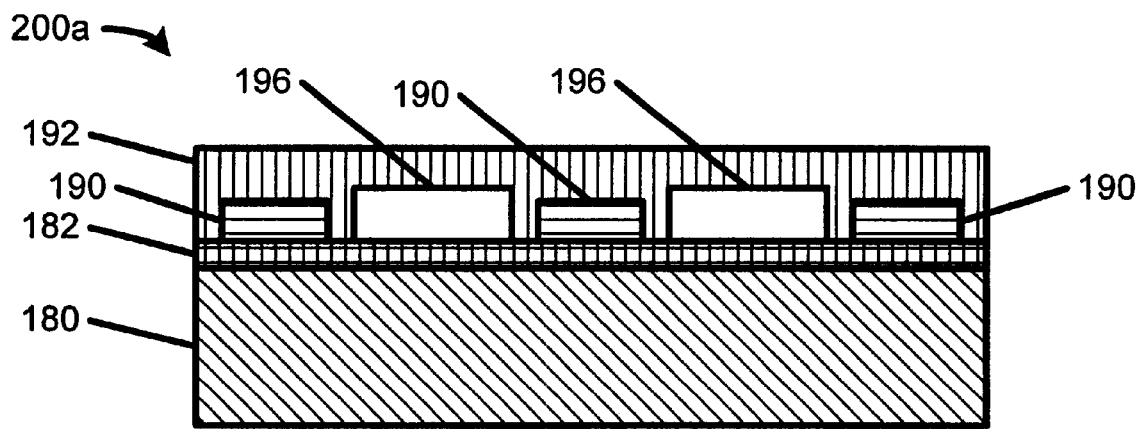

12. In FIG. 9K, the sacrificial material 184 is removed through the permanent dielectric layer 192 to form the air gaps 196. The removal of the sacrificial material is, in one embodiment, accomplished by thermal decomposition and passage of one or more of the decomposition products through the permanent dielectric layer 192 by diffusion. As above indicated, the sacrificial materials of the present invention will undergo thermal decomposition at temperatures on the order of about 450° C., and lower, with essentially no residue being left in the air gaps of the resultant semiconductor structure 200a. Also, the decomposition products are diffusable through many dielectric materials useful forming the permanent dielectric layer, including polyimides.

Figure 9L:
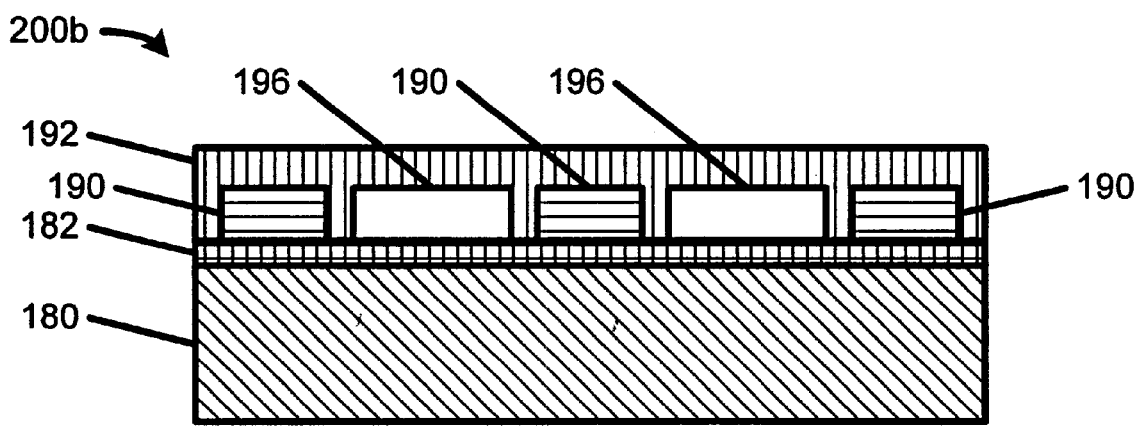

Referring specifically to FIG. 9L, FIG. 9L discloses another embodiment according to steps 1–12 discussed immediately above with the exception that the conductive layer 190 is planarized in step 10 as needed by any suitable technique including, for example, a wet chemical etch utilizing a suitable etching compound (e.g., nitric acid). Additionally, as can be seen from FIG. 9L, the planarization process in this embodiment is conducted so as to create gaps between adjacent portions of the sacrificial material 184 and the conductive layer 190 by removing a portion of the conductive layer adjacent to sacrificial material 184. Again, if a wet chemical etch is used a layer of silicon dioxide can be applied to the surface of the sacrificial layer to provide an etch stop. After completion of step 10 the device is further processed according to steps 11 and 12 as discussed above to yield semiconductor structure 200b.

Alternative air-gap structures may use various ways of forming the metal pattern so that it is not shorted together. First, electroless plating of metal may replace the electroplating of metal. Second, the metal pattern may be first formed on the silicon wafer (plated to its full height), and then the sacrificial material may be deposited. The sacrificial material covering the metal pattern then may be removed before the permanent dielectric is deposited, as by chemical mechanical polishing, or other techniques.

Figure 10A:
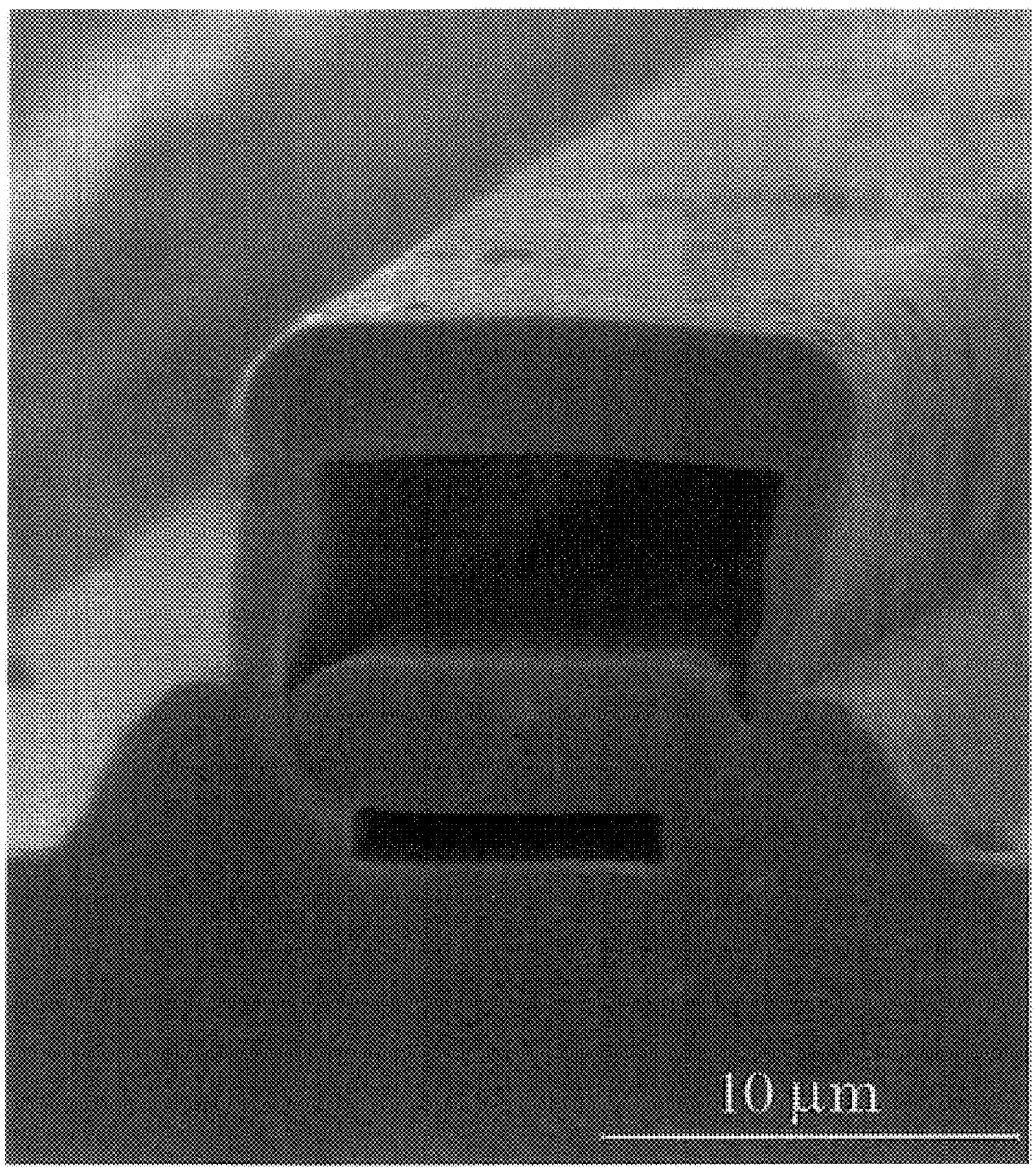
FIGS. 10A and 10B depict two exemplary multi-level air gap structures according to present invention.
Figure 10B:
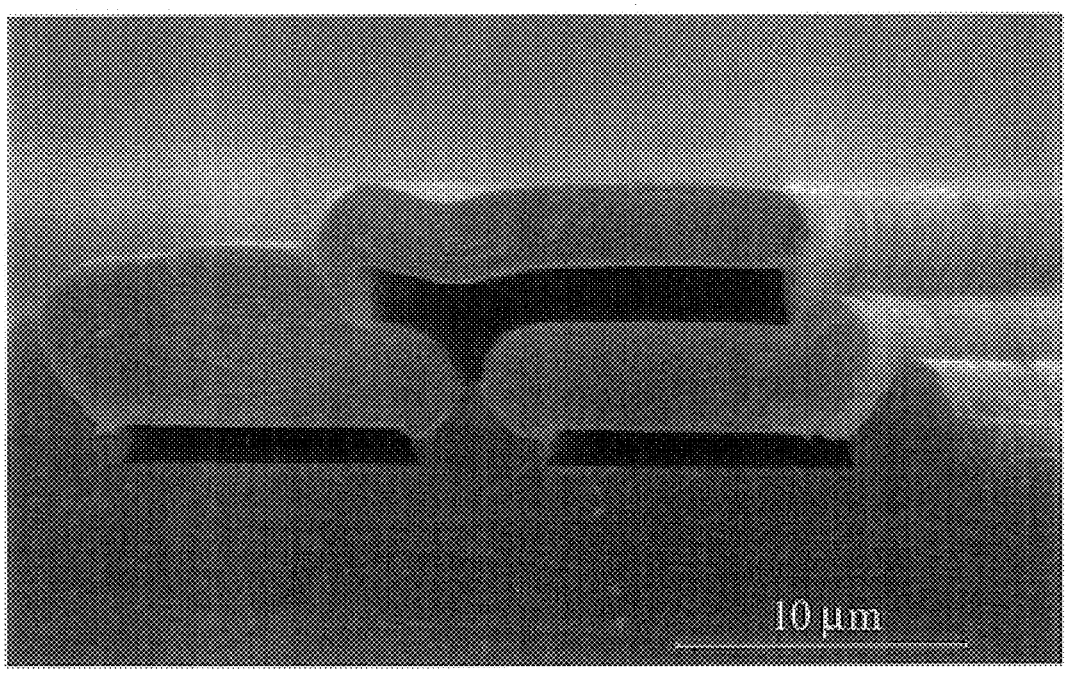

FIGS. 10A and 10B depict two possible multi-level air gap arrangements. It should be noted that the present invention is not limited to just these two arrangements. As can be seen from FIG. 10A, a multi-level air gap structure can be produced whereby two air gaps are formed on either side vertically of, for example, a conductive line. FIG. 10B depicts a multi-level staggered arrangement. As discussed above, the present invention is not limited to just these arrangements. Rather, virtually any 3 dimensional arrangement is possible utilizing the previously discussed production methods.

Reference herein is made to passage of the decomposition products of the sacrificial layer through the permanent layer. This broadly is intended to encompass passage in any manner, including though holes or passages in the permanent layer that may later be closed. However, in one embodiment, passage is by diffusion through a solid permanent layer.

Furthermore, it should be noted that in the preceding text, range and ratio limits may be combined.

Although the invention has been shown and described with respect to a certain embodiment or embodiments, it is obvious that equivalent alterations and modifications will occur to others skilled in the art upon the reading and understanding of this specification and the annexed drawings. In particular regard to the various functions performed by the above described integers (components, assemblies, devices, compositions, etc.), the terms (including a reference to a "means") used to describe such integers are intended to correspond, unless otherwise indicated, to any integer which performs the specified function of the described integer (i.e., that is functionally equivalent), even though not structurally equivalent to the disclosed structure which performs the function in the herein illustrated exemplary embodiment or embodiments of the invention. In addition, while a particular feature of the invention may have been described above with respect to only one of several illustrated embodiments, such feature may be combined with one or more other features of the other embodiments, as may be desired and advantageous for any given or particular application.

What is claimed is:

1. A method of forming an air gap within a semiconductor structure comprising the steps of:
   (i) using a sacrificial material to occupy a closed interior volume in a semiconductor structure;
   (ii) causing the sacrificial material to decompose into one or more gaseous decomposition products; and
   (iii) removing at least one of the one or more gaseous decomposition products by passage through at least one solid layer contiguous to the interior volume,
   wherein the decomposition of the sacrificial material leaves an air gap at the closed interior volume previously occupied thereby, and the sacrificial material comprises a polymer composition selected from one or more polycarbonate polymers, polyester polymers, polyether polymers, methacrylate polymers, acrylate polymers, or mixtures thereof.

2. The method of claim 1, wherein the sacrificial material is a polycarbonate polymer comprises repeating units represented by the general formula of:

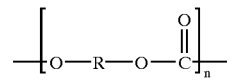

where R represents linear and branched ($C_1$ to $C_{20}$) alkyl, hydrocarbyl substituted and unsubstituted ($C_5$ to $C_{12}$)

cycloalkyl, hydrocarbyl substituted and unsubstituted ($C_6$ to $C_{40}$) aryl, hydrocarbyl substituted and unsubstituted ($C_7$ to $C_{15}$) aralkyl, ($C_3$ to $C_{20}$) alkynyl, linear and branched ($C_3$ to $C_{20}$) alkenyl and n is equal to 2 to about 100,000.

3. The method of claim 2, wherein n is equal to 2 to about 10,000.

4. The method of claim 2, wherein n is equal to 2 to about 1,000.

5. The method of claim 2, wherein the sacrificial material is selected from polyethylene carbonate, polyproplyene carbonate or a mixture thereof.

6. The method of claim 1, wherein the sacrificial material is a polyester polymer comprising repeating units represented by the general formula of:

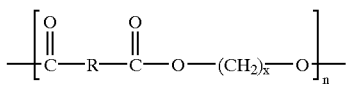

where R represents linear and branched ($C_1$ to $C_{20}$) alkyl, hydrocarbyl substituted and unsubstituted ($C_5$ to $C_{12}$) cycloalkyl, hydrocarbyl substituted and unsubstituted ($C_6$ to $C_{40}$) aryl, hydrocarbyl substituted and unsubstituted ($C_7$ to $C_{15}$) aralkyl, ($C_3$ to $C_{20}$) alkynyl, linear and branched ($C_3$ to $C_{20}$) alkenyl;

x is an integer from 1 to about 20;

and n is equal to 2 to about 100,000.

7. The method of claim 6, wherein n is equal to 2 to about 10,000.

8. The method of claim 6, wherein n is equal to 2 to about 1,000.

9. The method of claim 6, wherein x is an integer from 1 to about 10.

10. The method of claim 6, wherein x is an integer from 1 to about 6.

11. The method of claim 1, wherein the sacrificial material is a polyether polymer comprising repeating units represented by the general formula of:

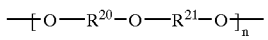

where $R^{20}$ and $R^{21}$ independently represent linear and branched ($C_1$ to $C_{20}$) alkyl, hydrocarbyl substituted and unsubstituted ($C_5$ to $C_{12}$) cycloalkyl, hydrocarbyl substituted and unsubstituted ($C_6$ to $C_{40}$) aryl, hydrocarbyl substituted and unsubstituted ($C_7$ to $C_{15}$) aralkyl, ($C_3$ to $C_{20}$) alkynyl, linear and branched ($C_3$ to $C_{20}$) alkenyl and n is equal to 2 to about 100,000.

12. The method of claim 11, wherein n is equal to 2 to about 10,000.

13. The method of claim 11, wherein n is equal to 2 to about 1,000.

14. The method of claim 1, wherein the sacrificial material is selected from a polymethyl methacrylate polymer, an acrylate polymer or a mixture thereof where the polymers present each have a molecular weight of about 1,000 to about 1,000,000.

15. The method of claim 14, wherein the polymethyl methacrylate and/or the acrylate polymer has a molecular weight of about 10,000 to about 500,000.

16. The method of claim 14, wherein the polymethyl methacrylate and/or the acrylate polymer has a molecular weight of about 100,000 to about 250,000.

17. A method of forming one or more air gaps in a semiconductor structure comprising the steps of:

(I) forming a patterned layer of sacrificial material on a substrate corresponding to a pattern of one or more gaps to be formed in the semiconductor structure;

(II) depositing a second material on the substrate within regions bordered by the sacrificial material;

(III) forming an overcoat layer of material overlying the patterned layer of sacrificial material and second material in the regions bordered by the sacrificial material;

(IV) causing the sacrificial material to decompose into one or more gaseous decomposition products; and (V) removing at least one of the one or more gaseous decomposition products by passage through the overcoat layer so that one or more air gaps are formed within the semiconductor structure, wherein the sacrificial material is a polymer composition selected from one or more polycarbonate polymers, polyester polymers, polyether polymers, methacrylate polymers, acrylate polymers, or mixtures thereof.

18. The method of claim 17, wherein the sacrificial material is a polycarbonate polymer comprising repeating units represented by the general formula of:

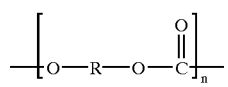

where R represents linear and branched ($C_1$ to $C_{20}$) alkyl, hydrocarbyl substituted and unsubstituted ($C_5$ to $C_{12}$) cycloalkyl, hydrocarbyl substituted and unsubstituted ($C_6$ to $C_{40}$) aryl, hydrocarbyl substituted and unsubstituted ($C_7$ to $C_{15}$) aralkyl, ($C_3$ to $C_{20}$) alkynyl, linear and branched ($C_3$ to $C_{20}$) alkenyl and n is equal to 2 to about 100,000.

19. The method of claim 18, wherein n is equal to 2 to about 10,000.

20. The method of claim 18, wherein the sacrificial material is selected from polyethylene carbonate, polyproplyene carbonate or a mixture thereof.

21. The method of claim 17, wherein the sacrificial material is a polyester polymer comprising repeating units represented by the general formula of:

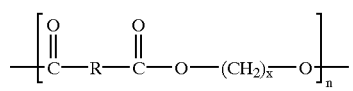

where R represents linear and branched ($C_1$ to $C_{20}$) alkyl, hydrocarbyl substituted and unsubstituted ($C_5$ to $C_{12}$) cycloalkyl, hydrocarbyl substituted and unsubstituted ($C_6$ to $C_{40}$) aryl, hydrocarbyl substituted and unsubstituted ($C_7$ to $C_{15}$) aralkyl, ($C_3$ to $C_{20}$) alkynyl, linear and branched ($C_3$ to $C_{20}$) alkenyl;

x is an integer from 1 to about 20; and n is equal to 2 to about 100,000.

22. The method of claim 21, wherein n is equal to 2 to about 10,000.

23. The method of claim 21, wherein x is an integer from 1 to about 10.

24. The method of claim 17, wherein the sacrificial material is a polyether polymer comprising repeating units represented by the general formula of:

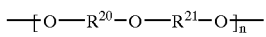

where $R^{20}$ and $R^{21}$ independently represent linear and branched ($C_1$ to $C_{20}$) alkyl, hydrocarbyl substituted and unsubstituted ($C_5$ to $C_{12}$) cycloalkyl, hydrocarbyl substituted and unsubstituted ($C_6$ to $C_{40}$) aryl, hydrocarbyl substituted and unsubstituted ($C_7$ to $C_{15}$) aralkyl, ($C_3$ to $C_{20}$) alkynyl, linear and branched ($C_3$ to $C_{20}$) alkenyl and n is equal to 2 to about 100,000.

25. The method of claim 24, wherein n is equal to 2 to about 10,000.

26. The method of claim 17, wherein the sacrificial material is selected from a polymethyl methacrylate polymer, an acrylate polymer or a mixture thereof where the polymers present each have a molecular weight of about 1,000 to about 1,000,000.

27. The method of claim 26, wherein the polymethyl methacrylate and/or the acrylate polymer has a molecular weight of about 10,000 to about 500,000.

28. A method of forming air gaps within a semiconductor structure comprising the steps of:
using at least one sacrificial material to occupy simultaneously or sequentially at least two closed interior volumes in a semiconductor structure, wherein the at least two closed interior volumes are on different levels of the semiconductor structure;
causing the at least one sacrificial material occupying the at least two closed interior volumes to decompose either simultaneously or sequentially into one or more gaseous decomposition products; and
removing at least one of the one or more gaseous decomposition products by passage through at least one solid layer contiguous to the interior volume.

29. The method of claim 28, wherein the at least one sacrificial material is simultaneously decomposed into one or more gaseous decomposition products which are remove via passage through at least one solid layer contiguous to the interior volume.

30. The method of claim 29, wherein the at least one sacrificial material is selected from one or more norbornene polymers, polycarbonate polymers, polyester polymers, polyether polymers, methacrylate polymers, acrylate polymers, or mixtures thereof.

31. The method of claim 30, wherein the at least one sacrificial material is selected from one or more norbornene polymers.

32. The method of claim 31, wherein the norbornene polymer comprises repeating units of the general formula:

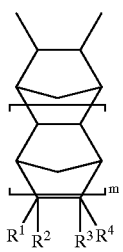

I wherein
$R^1$ and $R^4$ independently represent hydrogen or linear or branched ($C_1$ to $C_{20}$) alkyl;
$R^2$ and $R^3$ independently represent hydrogen, linear or branched ($C_1$ to $C_{20}$) alkyl or the groups:

Ia $R^9$ independently is hydrogen, methyl, or ethyl;
$R^{10}$, $R^{11}$, and $R^{12}$ independently represent linear or branched ($C_1$ to $C_{20}$) alkyl, linear or branched ($C_1$ to $C_{20}$) alkoxy, linear or branched ($C_1$ to $C_{20}$) alkyl carbonyloxy, and substituted or unsubstituted ($C_6$ to $C_{20}$) aryloxy;
m is a number from 0 to 4; and
n is a number from 0 to 5; and
at least one of substituents $R^2$ and $R^3$ is selected from the silyl group represented by the formula set forth under Ia.

33. The method of claim 32, wherein in Formula I above, m is preferably 0 or 1 as represented by structures Ib and Ic, respectively:

Ib

Ic wherein $R^1$ to $R^4$ are as previously defined and at least one of $R^2$ and $R^3$ is a silyl substituent represented by Ia.

34. The method of claim 32, wherein $R^1$ and $R^4$ taken together with the two ring carbon atoms to which they are attached comprise a repeating unit of the following structure:

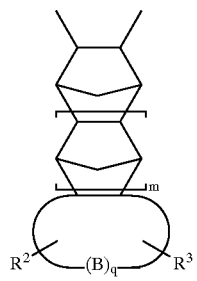

wherein B is a methylene group, q is a number from 2 to 6, and $R^2$ and $R^3$ are as defined above.

35. The method of claim 32, wherein the norbornene polymer further comprises hydrocarbyl substituted polycyclic repeating units selected from units represented by Formula II below:

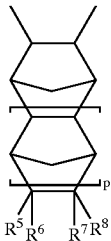

wherein $R^5$, $R^6$, $R^7$, and $R^8$ independently represent hydrogen, linear and branched ($C_1$ to $C_{20}$) alkyl, hydrocarbyl substituted and unsubstituted ($C_5$ to $C_{12}$) cycloalkyl, hydrocarbyl substituted and unsubstituted ($C_6$ to $C_{40}$) aryl, hydrocarbyl substituted and unsubstituted ($C_7$ to $C_{15}$) aralkyl, ($C_3$ to $C_{20}$) alkynyl, linear and branched ($C_3$ to $C_{20}$) alkenyl, or vinyl;

any of $R^5$ and $R^6$ or $R^7$ and $R^8$ can be taken together to form a ($C_1$ to $C_{10}$) alkylidenyl group, $R^5$ and $R^8$ when taken with the two ring carbon atoms to which they are attached can represent saturated and unsaturated cyclic groups containing 4 to 12 carbon atoms or an aromatic ring containing 6 to 17 carbon atoms; and p is 0, 1, 2, 3, or 4.

36. The method of claim 31, wherein the norbornene polymer comprises repeating units represented by Formula III below:

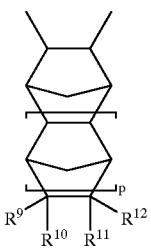

wherein $R^9$ to $R^{12}$ independently represent a polar substituent selected from the group:
—$(A)_n$—C(O)OR", —$(A)_n$—OR", —$(A)_n$—OC(O)R", —$(A)_n$—OC(O)OR", —$(A)_n$—C(O)R", —$(A)_n$—OC(O)C(O)OR", —$(A)_n$—O—A'—C(O)OR", —$(A)_n$—OC(O)—A'—C(O)OR", —$(A)_n$—C(O)O—A'—C(O)OR", —$(A)_n$—C(O)—A'—OR", —$(A)_n$—C(O)O—A'—OC(O)OR", —$(A)_n$—C(O)O—A'—O—A'—C(O)OR", —$(A)_n$—C(O)O—A'—OC(O)C(O)OR", —$(A)_n$—C(R")$_2$CH(R")(C(O)OR"), and —$(A)_n$—C(R")$_2$CH(C(O)OR")$_2$;

p is 0, 1, 2, 3, 4, or 5;

the moieties A and A' independently represent a divalent bridging or spacer group selected from divalent hydrocarbon groups, divalent cyclic hydrocarbon groups, divalent oxygen containing groups, and divalent cyclic ethers and cyclic diethers; and n is an integer 0 or 1.

37. The method of claim 31, wherein the norbornene polymer comprises copolymers comprising a combination of repeating units represented by Formulae I and II, Formulae I and III, Formulae II and III or Formulae I, II and III, where Formula I is:

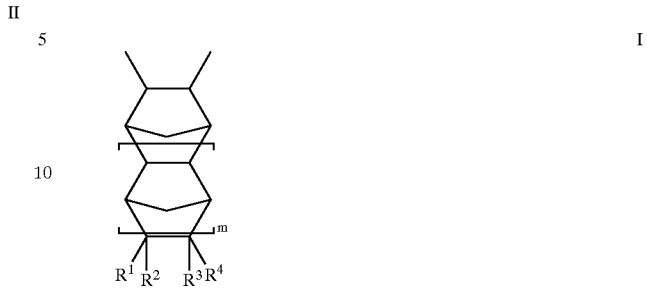

wherein
$R^1$ and $R^4$ independently represent hydrogen or linear or branched ($C_1$ to $C_{20}$) alkyl;
$R^2$ and $R^3$ independently represent hydrogen, linear or branched ($C_1$ to $C_{20}$) alkyl or the groups:

$R^9$ independently is hydrogen, methyl, or ethyl;
$R^{10}$, $R^{11}$, and $R^{12}$ independently represent linear or branched ($C_1$ to $C_{20}$) alkyl, linear or branched ($C_1$ to $C_{20}$) alkoxy, linear or branched ($C_1$ to $C_{20}$) alkyl carbonyloxy, and substituted or unsubstituted ($C_6$ to $C_{20}$) aryloxy;
m is a number from 0 to 4; and
n is a number from 0 to 5; and
at least one of substituents $R^2$ and $R^3$ is selected from the silyl group represented by the formula set forth under Ia;

Formula II is

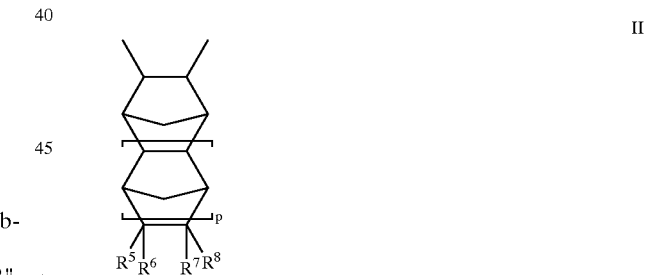

wherein
$R^5$, $R^6$, $R^7$, and $R^8$ independently represent hydrogen, linear and branched ($C_1$ to $C_{20}$) alkyl, hydrocarbyl substituted and unsubstituted ($C_5$ to $C_{12}$) cycloalkyl, hydrocarbyl substituted and unsubstituted ($C_6$ to $C_{40}$) aryl, hydrocarbyl substituted and unsubstituted ($C_7$ to $C_{15}$) aralkyl, ($C_3$ to $C_{20}$) alkynyl, linear and branched ($C_3$ to $C_{20}$) alkenyl, or vinyl;

any of $R^5$ and $R^6$ or $R^7$ and $R^8$ can be taken together to form a ($C_1$ to $C_{10}$) alkylidenyl group, $R^5$ and $R^8$ when taken with the two ring carbon atoms to which they are attached can represent saturated and unsaturated cyclic groups containing 4 to 12 carbon atoms or an aromatic ring containing 6 to 17 carbon atoms; and p is 0, 1, 2, 3, or 4; and Formula III is

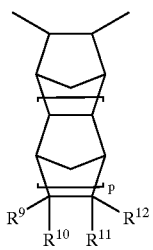

wherein
$R^9$ to $R^{12}$ independently represent a polar substituent selected from the group:
—(A)$_n$—C(O)OR", —(A)$_n$—OR", —(A)$_n$—OC(O)R", —(A)$_n$—OC(O)OR", —(A)$_n$—C(O)R", —(A)$_n$—OC(O)C(O)OR", —(A)$_n$—O—A'—C(O)OR", —(A)$_n$—OC(O)—A'—C(O)OR", —(A)$_n$—C(O)O—A'—C(O)OR", —(A)$_n$—C(O)—A'—OR", —(A)$_n$—C(O)O—A'—OC(O)OR", —(A)$_n$—C(O)O—A'—O—A'—C(O)OR", —(A)$_n$—C(O)O—A'—OC(O)C(O)OR", —(A)$_n$—C(R")$_2$CH(R")(C(O)OR"), and —(A)$_n$—C(R")$_2$CH(C(O)OR")$_2$;
p is 0, 1, 2, 3, 4, or 5;
the moieties A and A' independently represent a divalent bridging or spacer group selected from divalent hydrocarbon groups, divalent cyclic hydrocarbon groups, divalent oxygen containing groups, and divalent cyclic ethers and cyclic diethers; and
n is an integer 0 or 1.

38. The method of claim 28, wherein the at least one sacrificial material is selected from one or more norbornene polymers.

39. The method of claim 28, wherein the at least one sacrificial material is selected from one or more polycarbonate polymers, polyester polymers, polyether polymers, methacrylate polymers, acrylate polymers, or mixtures thereof.

40. The method of claim 39, wherein the sacrificial material is a polycarbonate polymer comprises repeating units represented by the general formula of:

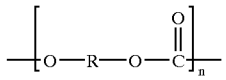

where R represents linear and branched ($C_1$ to $C_{20}$) alkyl, hydrocarbyl substituted and unsubstituted ($C_5$ to $C_{12}$) cycloalkyl, hydrocarbyl substituted and unsubstituted ($C_6$ to $C_{40}$) aryl, hydrocarbyl substituted and unsubstituted ($C_7$ to $C_{15}$) aralkyl, ($C_3$ to $C_{20}$) alkynyl, linear and branched ($C_3$ to $C_{20}$) alkenyl and n is equal to 2 to about 100,000.

41. The method of claim 40, wherein n is equal to 2 to about 10,000.

42. The method of claim 40, wherein the sacrificial material is selected from polyethylene carbonate, polyproplyene carbonate or a mixture thereof.

43. The method of claim 39, wherein the sacrificial material is a polyester polymer comprising repeating units represented by the general formula of:

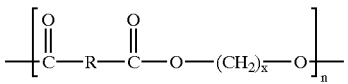

where R represents linear and branched ($C_1$ to $C_{20}$) alkyl, hydrocarbyl substituted and unsubstituted ($C_1$ to $C_{12}$) cycloalkyl, hydrocarbyl substituted and unsubstituted ($C_6$ to $C_{40}$) aryl, hydrocarbyl substituted and unsubstituted ($C_7$ to $C_{15}$) aralkyl, ($C_3$ to $C_{20}$) alkynyl, linear and branched ($C_3$ to $C_{20}$) alkenyl;
x is an integer from 1 to about 20; and
n is equal to 2 to about 100,000.

44. The method of claim 43, wherein n is equal to 2 to about 10,000.

45. The method of claim 43, wherein x is an integer from 1 to about 10.

46. The method of claim 39, wherein the sacrificial material is a polyether polymer comprising repeating units represented by the general formula of:

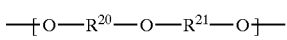

where $R^{20}$ and $R^{21}$ independently represent linear and branched ($C_1$ to $C_{20}$) alkyl, hydrocarbyl substituted and unsubstituted ($C_5$ to $C_{12}$) cycloalkyl, hydrocarbyl substituted and unsubstituted ($C_6$ to $C_{40}$) aryl, hydrocarbyl substituted and unsubstituted ($C_7$ to $C_{15}$) aralkyl, ($C_3$ to $C_{20}$) alkynyl, linear and branched ($C_3$ to $C_{20}$) alkenyl and n is equal to 2 to about 100,000.

47. The method of claim 46, wherein n is equal to 2 to about 10,000.

48. The method of claim 39, wherein the sacrificial material is selected from a polymethyl methacrylate polymer, an acrylate polymer or a mixture thereof where the polymers present each have a molecular weight of about 1,000 to about 1,000,000.

49. A method of forming one or more air gaps in a semiconductor structure comprising the steps of:
(A) forming a patterned layer of a first sacrificial material on one side of a substrate corresponding to a pattern of one or more gaps to be formed in the semiconductor structure;
(B) depositing a second material on the substrate within regions bordered by the first sacrificial material;
(C) forming a first overcoat layer of material overlying the patterned layer of the first sacrificial material and the second material in the regions bordered by the first sacrificial material;
(D) causing the first sacrificial material to decompose into one or more gaseous decomposition products;
(E) removing at least one of the one or more gaseous decomposition products by passage through the first overcoat layer so that one or more air gaps are formed within the semiconductor structure;
(F) forming a patterned layer of a second sacrificial material on the first overcoat layer corresponding to a pattern of one or more gaps to be formed in the semiconductor structure;
(G) depositing a third material on the first overcoat layer substrate within regions bordered by the second sacrificial material;
(H) forming a second overcoat layer of material overlying the patterned layer of the second sacrificial material and the third material in the regions bordered by the second sacrificial material;

(I) causing the second sacrificial material to decompose into one or more gaseous decomposition products; and (J) removing at least one of the one or more gaseous decomposition products by passage through the overcoat layers so that one or more air gaps are formed within the semiconductor structure, wherein the first and second sacrificial materials are independently selected from one or more polycarbonate polymers, polyester polymers, polyether polymers, methacrylate polymers, acrylate polymers, or mixtures thereof.

50. A method of forming one or more air gaps in a semiconductor structure comprising the steps of:

(A) forming a patterned layer of a first sacrificial material on one side of a substrate corresponding to a pattern of one or more gaps to be formed in the semiconductor structure;

(B) depositing a second material on the substrate within regions bordered by the first sacrificial material;

(C-1) forming a first overcoat layer of material overlying the patterned layer of the first sacrificial material and the second material in the regions bordered by the first sacrificial material;

(C-2) forming a patterned layer of a second sacrificial material on the first overcoat layer corresponding to a pattern of one or more gaps to be formed in the semiconductor structure;

(C-3) depositing a third material on the first overcoat layer within regions bordered by the second sacrificial material;

(C-4) forming a second overcoat layer of material overlying the patterned layer of the second sacrificial material and the third material in the regions bordered by the second sacrificial material;

(D') causing the first and second sacrificial materials to decompose into one or more gaseous decomposition products; and (E') removing at least one of the one or more gaseous decomposition products by passage through the overcoat layers so that one or more air gaps are formed within the semiconductor structure, wherein the first and second sacrificial materials are independently selected from one or more norbornene polymers, polycarbonate polymers, polyester polymers, polyether polymers, methacrylate polymers, acrylate polymers, or mixtures thereof.

51. A method of forming one or more air gaps in a semiconductor structure comprising the steps of:

using a sacrificial material to occupy at least one first closed interior volume in a semiconductor structure and using a conductive material to occupy at least one second closed interior volume in a semiconductor structure, the at least one first closed interior volume and the at least one second closed interior volume defining at least one gap therebetween;

forming an overcoat layer of material on the sacrificial material and the conductive material with the overcoat material extending into the at least one gap;

causing the sacrificial material to decompose into one or more gaseous decomposition products; and removing at least one of the one or more gaseous decomposition products by passage through the first overcoat layer so that one or more air gaps are formed within the semiconductor structure, thereby yielding overcoated conductive structures.

52. The method of claim 51, wherein the overcoat material completely fills the one or more gaps between the sacrificial material and the conductive material.

53. The method of claim 51, wherein the sacrificial material is selected from one or more norbornene polymers, polycarbonate polymers, polyester polymers, polyether polymers, methacrylate polymers, acrylate polymers, or mixtures thereof.

54. The method of claim 53, wherein the sacrificial material is selected from one or more norbornene polymers.

55. The method of claim 51, wherein the height of the at least one first closed interior volume exceeds the height of the at least one second closed interior volume.

56. The method of claim 51, wherein the height of the at least one second closed interior volume exceeds the height of the at least one first closed interior volume.

57. The method of claim 51, wherein the sacrificial material is a polycarbonate polymer comprises repeating units represented by the general formula of:

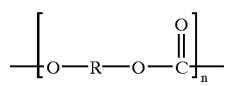

where R represents linear and branched ($C_1$ to $C_{20}$) alkyl, hydrocarbyl substituted and unsubstituted ($C_5$ to $C_{12}$) cycloalkyl, hydrocarbyl substituted and unsubstituted ($C_6$ to $C_{40}$) aryl, hydrocarbyl substituted and unsubstituted ($C_7$ to $C_{15}$) aralkyl, ($C_3$ to $C_{20}$) alkynyl, linear and branched ($C_3$ to $C_{20}$) alkenyl and n is equal to 2 to about 100,000.

58. The method of claim 57, wherein n is equal to 2 to about 10,000.

59. The method of claim 57, wherein the sacrificial material is selected from polyethylene carbonate, polyproplyene carbonate or a mixture thereof.

60. The method of claim 51, wherein the sacrificial material is a polyester polymer comprises repeating units represented by the general formula of:

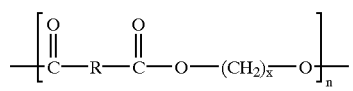

where R represents linear and branched ($C_1$ to $C_{20}$) alkyl, hydrocarbyl substituted and unsubstituted ($C_5$ to $C_{12}$) cycloalkyl, hydrocarbyl substituted and unsubstituted ($C_6$ to $C_{40}$) aryl, hydrocarbyl substituted and unsubstituted ($C_7$ to $C_{15}$) aralkyl, ($C_3$ to $C_{20}$) alkynyl, linear and branched ($C_3$ to $C_{20}$) alkenyl;

x is an integer from 1 to about 20; and n is equal to 2 to about 100,000.

61. The method of claim 60, wherein n is equal to 2 to about 10,000.

62. The method of claim 60, wherein x is an integer from 1 to about 10.

63. The method of claim 51, wherein the sacrificial material is a polyether polymer comprises repeating units represented by the general formula of:

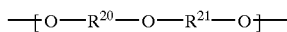

where $R^{20}$ and $R^{21}$ independently represent linear and branched ($C_1$ to $C_{20}$) alkyl, hydrocarbyl substituted and unsubstituted ($C_5$ to $C_{12}$) cycloalkyl, hydrocarbyl substituted and unsubstituted ($C_6$ to $C_{40}$) aryl, hydrocarbyl substituted and unsubstituted ($C_7$ to $C_{15}$) aralkyl, ($C_3$ to $C_{20}$) alkynyl, linear and branched ($C_3$ to $C_{20}$) alkenyl and n is equal to 2 to about 100,000.

64. The method of claim 63, wherein n is equal to 2 to about 10,000.

65. The method of claim 51, wherein the sacrificial material is selected from a polymethyl methacrylate, an acrylate polymer or a mixture thereof where the polymers present each have a molecular weight of about 1,000 to about 1,000,000.

66. The method of claim 65, wherein the polymethyl methacrylate and/or the acrylate polymer has a molecular weight of about 100,000 to about 250,000.

* * * * *